(12) United States Patent
Yu et al.

(10) Patent No.: US 9,496,196 B2
(45) Date of Patent: Nov. 15, 2016

(54) PACKAGES AND METHODS OF MANUFACTURE THEREOF

(71) Applicant: Taiwan Semiconductor Manufacturing Company, Ltd., Hsin-Chu (TW)

(72) Inventors: Chen-Hua Yu, Hsin-Chu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/460,735

(22) Filed: Aug. 15, 2014

(65) Prior Publication Data
US 2016/0049385 A1   Feb. 18, 2016

(51) Int. Cl.
*H01L 25/065* (2006.01)
*H01L 23/31* (2006.01)
(Continued)

(52) U.S. Cl.
CPC ....... *H01L 23/3107* (2013.01); *H01L 23/3128* (2013.01); *H01L 23/481* (2013.01); *H01L 23/5389* (2013.01); *H01L 24/19* (2013.01); *H01L 25/105* (2013.01); *H01L 23/49811* (2013.01); *H01L 23/5385* (2013.01); *H01L 2224/0401* (2013.01); *H01L 2224/08225* (2013.01); *H01L 2224/12105* (2013.01); *H01L 2224/13025* (2013.01); *H01L 2224/16145* (2013.01); *H01L 2224/16227* (2013.01); *H01L 2224/17181* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); (Continued)

(58) Field of Classification Search
CPC ................................... H01L 25/0657
See application file for complete search history.

(56) References Cited

U.S. PATENT DOCUMENTS

| 8,754,514 B2 | 6/2014 | Yu et al. |
| 2011/0037169 A1* | 2/2011 | Pagaila ................ H01L 21/561 257/737 |

(Continued)

FOREIGN PATENT DOCUMENTS

| KR | 100836642 | 6/2008 |
| KR | 1020070022364 | 6/2008 |

(Continued)

*Primary Examiner* — Su C Kim
*Assistant Examiner* — David S Wilbert
(74) *Attorney, Agent, or Firm* — Slater Matsil, LLP

(57) ABSTRACT

Packages and methods of manufacture thereof are described. In an embodiment, a package may include a first chip package and a die structure disposed over the first chip package. In an embodiment, the first chip package may include: a molding compound; a first die within the molding compound; a first via structure and a second via structure within the molding compound at opposite lateral portions of the first die, wherein the first and second via structures extend between an active surface of the first die and a first surface of the molding compound; and a second die within the molding compound, the second die disposed at the active surface of the first die and between the first via structure and the second via structure.

20 Claims, 28 Drawing Sheets

(51) Int. Cl.
*H01L 23/48* (2006.01)
*H01L 23/538* (2006.01)
*H01L 23/00* (2006.01)
*H01L 25/10* (2006.01)
*H01L 23/498* (2006.01)

(52) U.S. Cl.
CPC ............... *H01L 2224/73209* (2013.01); *H01L 2224/73253* (2013.01); *H01L 2224/73259* (2013.01); *H01L 2224/73265* (2013.01); *H01L 2224/81005* (2013.01); *H01L 2224/83005* (2013.01); *H01L 2225/0651* (2013.01); *H01L 2225/06513* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/1815* (2013.01); *H01L 2924/18161* (2013.01); *H01L 2924/18162* (2013.01); *H01L 2924/19107* (2013.01)

(56) References Cited

U.S. PATENT DOCUMENTS

| 2012/0086109 | A1* | 4/2012 | Kim et al. | 257/659 |
| 2012/0211885 | A1* | 8/2012 | Choi et al. | 257/737 |
| 2013/0056871 | A1 | 3/2013 | Yu et al. | |
| 2013/0175702 | A1 | 7/2013 | Choi et al. | |
| 2014/0264831 | A1* | 9/2014 | Meyer | 257/737 |
| 2014/0347943 | A1* | 11/2014 | Kim et al. | 365/200 |
| 2015/0028448 | A1* | 1/2015 | Hosseini | H01L 23/5389 257/531 |

FOREIGN PATENT DOCUMENTS

| KR | 1020110123297 | 11/2011 |
| KR | 20120040039 | 4/2012 |
| KR | 101261482 | 5/2013 |
| KR | 1020110077466 | 5/2013 |
| KR | 1020130082313 | 7/2013 |
| KR | 101368538 | 2/2014 |

\* cited by examiner

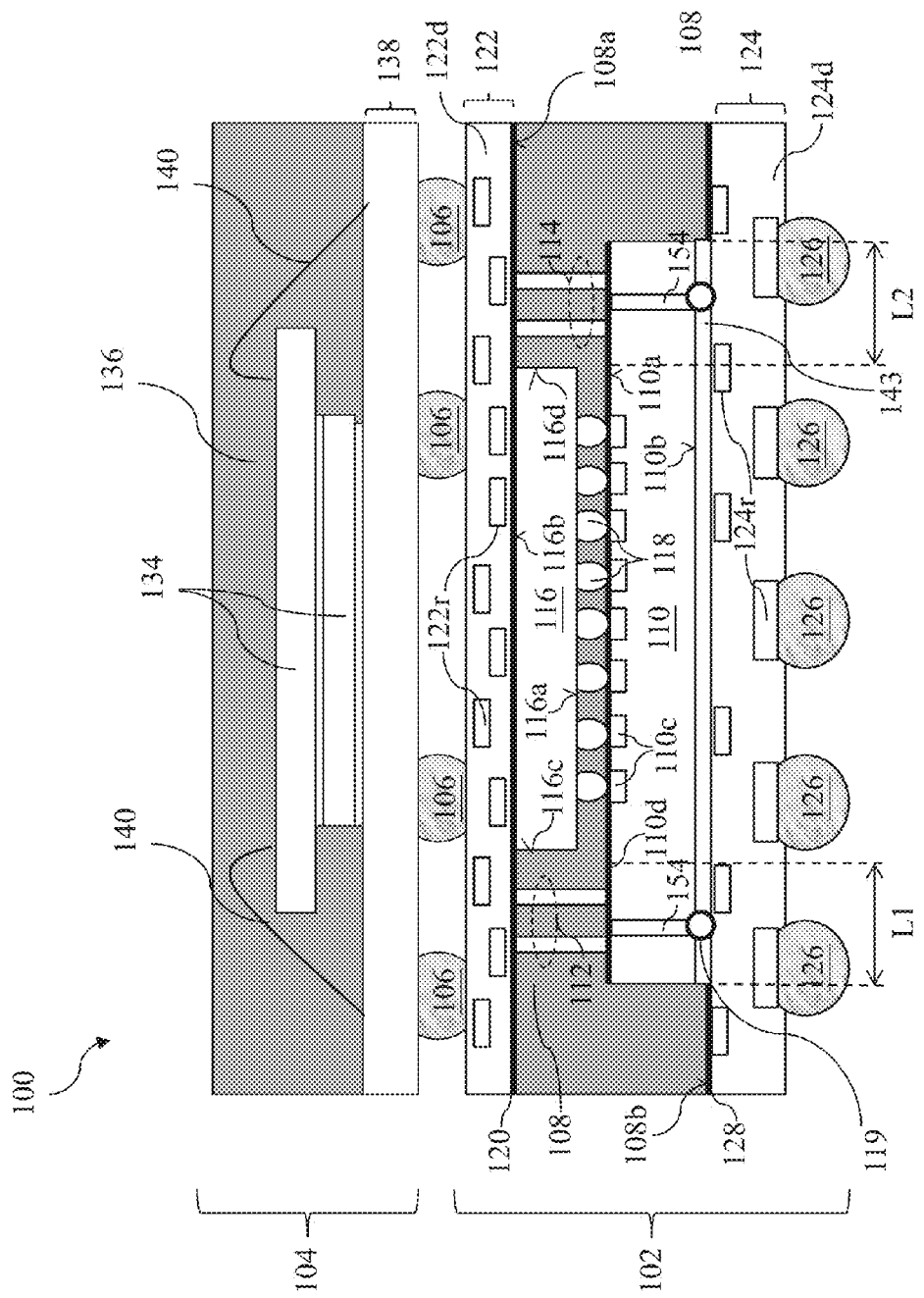

PACKAGES AND METHODS OF MANUFACTURE THEREOF

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) help to resolve the above-discussed limitations. Technologies in 3D IC include wafer-on-wafer, die-on-wafer and die-on-die. In a typical formation process of wafer-on-wafer 3D IC, a plurality of wafers, each including an integrated circuit, are formed. The wafers are then bonded with the devices aligned. Much higher device density has been achieved using 3D IC technology. Accordingly, 3D IC technology has the potential of being the mainstream technology of the next generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1J show chip packages, in accordance with some embodiments.

DETAILED DESCRIPTION

Figure 1A:
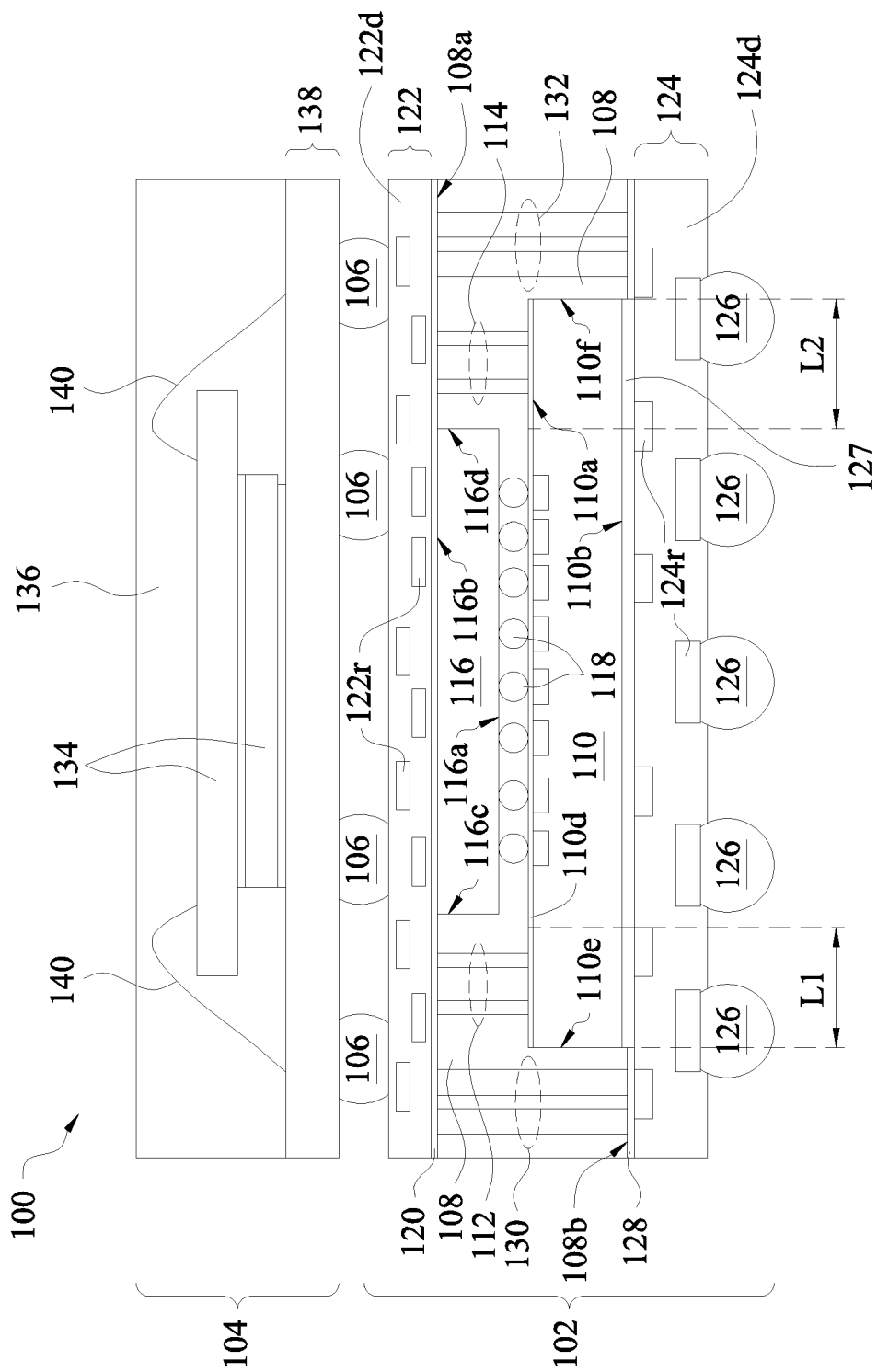

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a package 100, in accordance with one or more embodiments. The package 100 may include a first chip package 102 and a second chip package 104 disposed over the first chip package 102. The package 100 may include a first plurality of connectors 106 disposed between the first chip package 102 and the second chip package 104. The first plurality of connectors 106 may electrically couple or electrically connect the first chip package 102 and the second chip package 104 to each other. Only four connectors 106 are shown as an example, however, the number of connectors 106 may be less than four (e.g. one, two, or three) or may be more than four (e.g. five, six, seven, or more), in accordance with some embodiments. In the example shown in FIG. 1A, the first plurality of connectors 106 have a spherical shape (e.g. balls). However, in another embodiment the first plurality of connectors 106 may have another shape, e.g. pillars, posts, bumps, or caps.

Figure 1B:
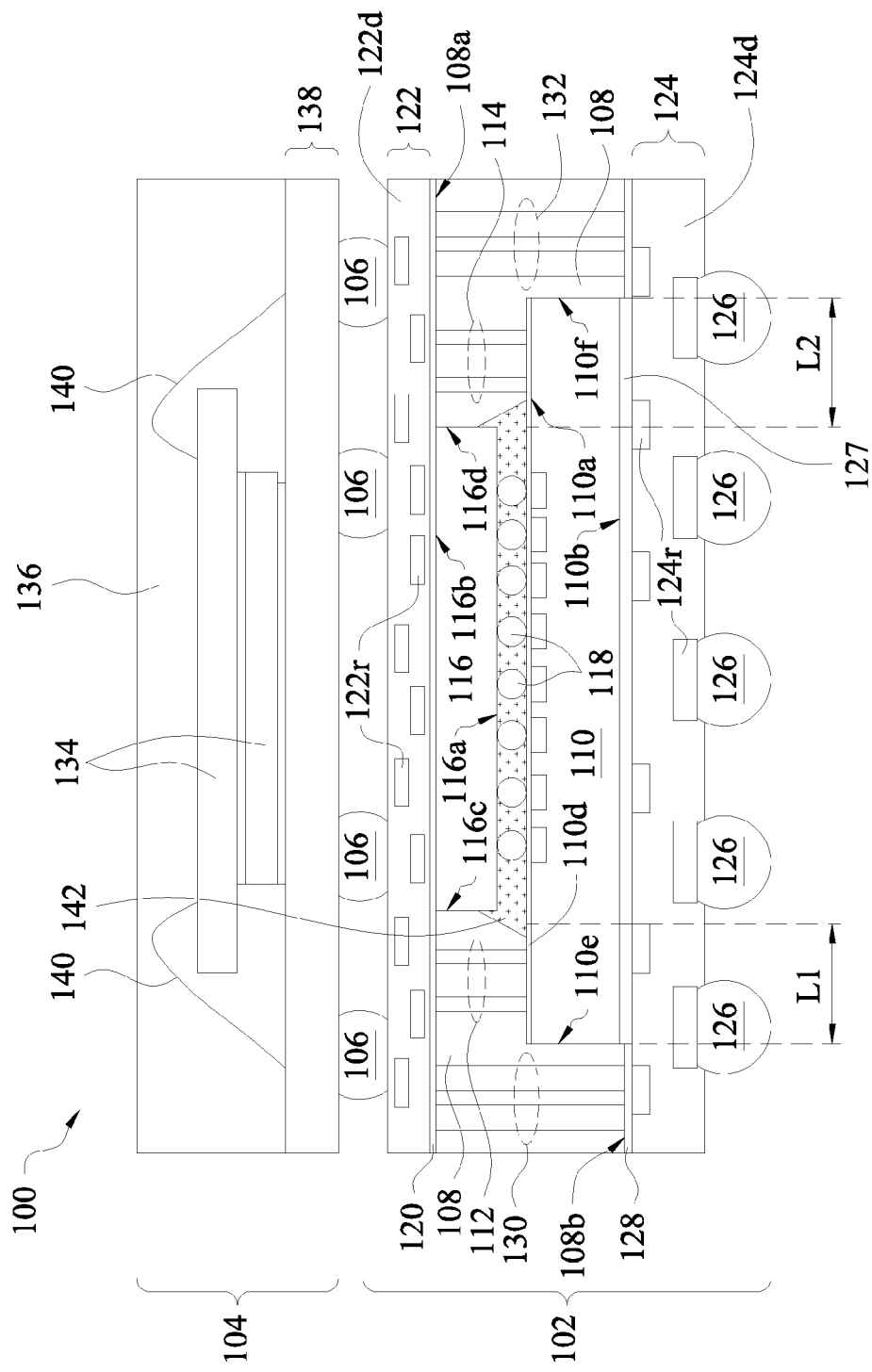
Figure 1C:
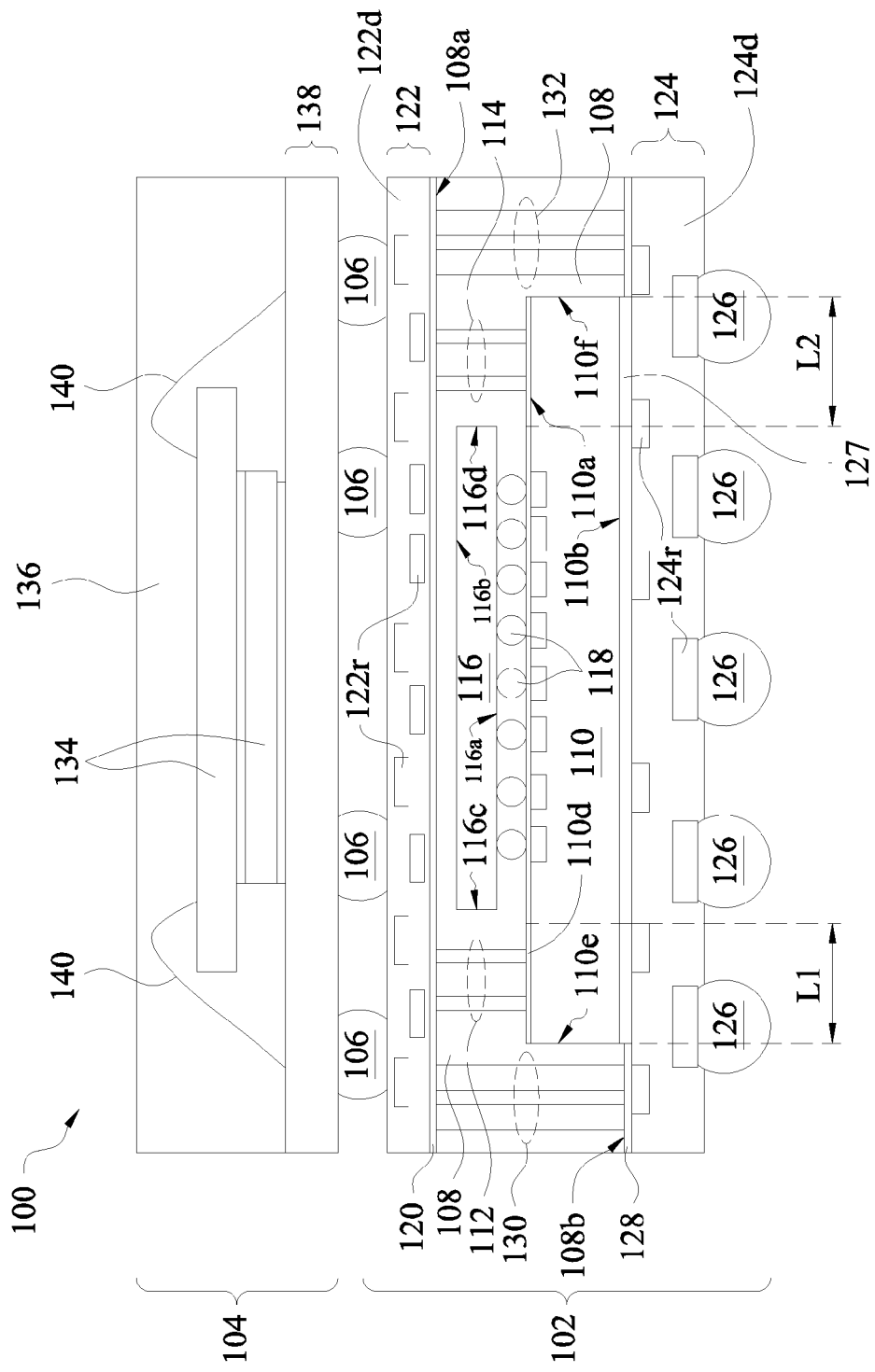
Figure 1D:
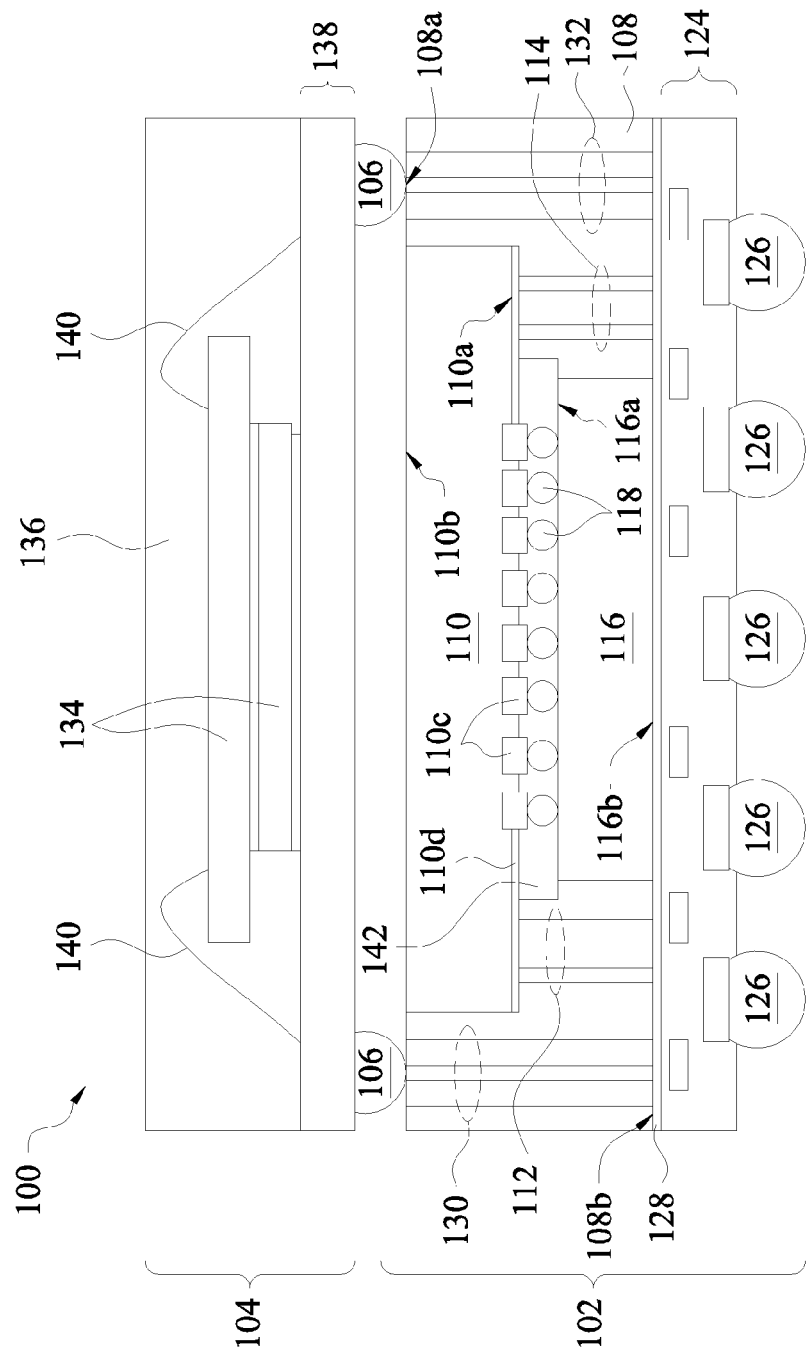
Figure 1E:
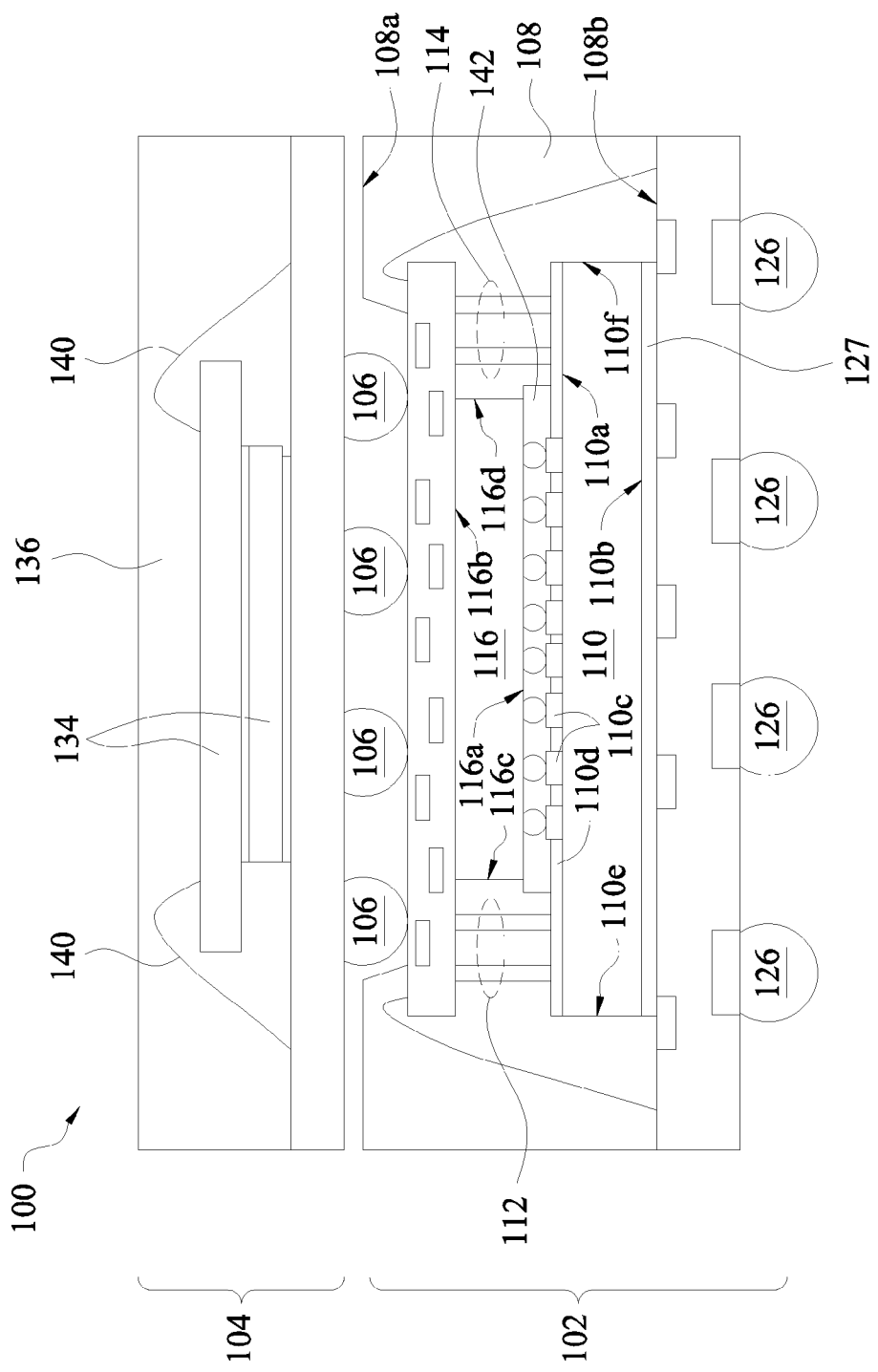
Figure 1F:
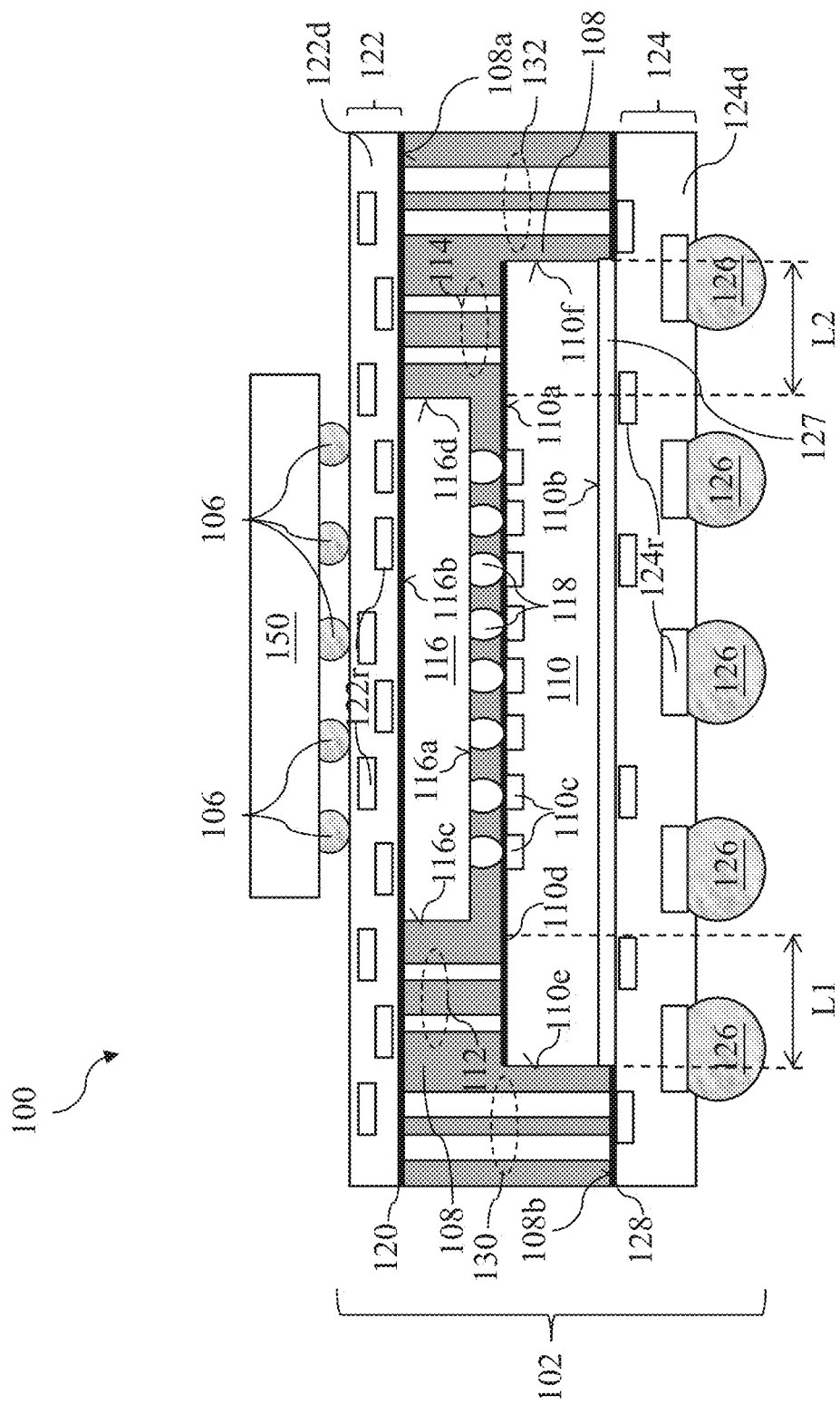

In an embodiment, the first plurality of connectors 106 may include controlled collapse chip connection (C4) bumps and/or micro bumps (e.g. as shown in FIG. 1F). In another embodiment, the first plurality of connectors 106 may include a ball grid array (BGA) (e.g. as shown in FIG. 1A). In such an embodiment, the first plurality of connectors 106 may be referred to as a top-side BGA. The first plurality of connectors 106 may include an electrically conductive material (e.g. a metal or metal alloy). For example, the first plurality of connectors 106 may include a solder material. By way of another example, the first plurality of connectors 106 may include at least one of tin, lead, copper, gold, silver, zinc, bismuth, magnesium, antimony, indium or an alloy thereof.

The first chip package 102 may include a molding compound 108 having a first surface 108a and a second surface 108b opposite the first surface 108a. The first surface 108a of the molding compound 108 may face the second chip package 104, and may be referred to as a front-side of the molding compound 108. The second surface 108b of the molding compound 108 may face away from the second chip package 104, and may be referred to as a back-side of the molding compound 108.

The molding compound 108 may include an insulating material, which may, for example, include at least one of an epoxy material, a polyurethane material or an epoxy blend including two or more epoxy materials. For example, the molding compound 108 may include epoxy, polyimide, benzocyclobutene (BCB), polybenzoxazole (PBO), and the like. The molding compound 108 may be filled with filler particles, such as silica filler, glass filler or similar fillers.

The first chip package 102 may include a first die 110. The first die 110 may be a die that may have been singulated from a wafer including a plurality of dies. The first die 110 may be used in one or more applications. For example, in an embodiment, the first die 110 may be used in microelectromechanical systems (MEMS), logic, memory, power, analog or RF communications applications, although other applications may be possible as well in accordance with other embodiments. As an example, in a logic and memory application, the first die 110 may include a logic chip.

The first die 110 may have a first surface 110a and a second surface 110b opposite the first surface 110a. The first surface 110a of the first die 110 may be an active surface of the first die 110. The first surface 110a of the first die 110 may face the second chip package 104, as shown in FIG. 1A. The first die 110 may include a plurality of contact pads 110c formed at the first surface 110a. In the example of FIG. 1A, the plurality of contact pads 110c are shown as being co-planar with the first surface 110a of the first die 110. However, in another embodiment, the plurality of contact pads 110c may be disposed atop the first surface 110a of the first die 110. Only eight contact pads 110c are shown as an example, however, the number of contact pads 110c may be less than eight (e.g. one, two, three, four, five, six, or seven) or may be more than eight (e.g. nine, ten, or more), in accordance with some embodiments. The plurality of contact pads 110c may include an electrically conductive material (e.g. including copper or an alloy thereof).

The first die 110 may include a first redistribution layer (RDL) 110d disposed at (e.g. disposed on or over) the first surface 110a of the first die 110. The first RDL 110d may be electrically coupled or electrically connected to the plurality of contact pads 110c of the first die 110. The first RDL 110d may include similar materials as the plurality of contact pads 110c.

The first die 110 may additionally include passivation layers, dielectric layers, and under bump metallization (UBM) layers disposed at (e.g. disposed on or over) the first surface 110a of the first die 110. These features of the first die 110 are not shown in FIG. 1A for the sake of simplicity. The passivation layers, dielectric layers, and UBM layers may, for example, be disposed over at least a portion of the first surface 110a, the plurality of contact pads 110c, and the first RDL 110d of the first die 110.

As shown in FIG. 1A, the first die 110 may be disposed within the molding compound 108. For example, the molding compound 108 may encompass or encapsulate the first die 110. For example, the molding compound 108 may be in contact with (e.g. direct physical contact with) a first sidewall 110e of the first die 110 and a second sidewall 110f of the first die 110 opposite the first sidewall 110e. Additionally, the molding compound 108 may cover the first surface 110a of the first die 110, as shown in FIG. 1A.

The first chip package 102 may include a first via structure 112 within the molding compound 108 at a first lateral portion L1 of the first die 110. The first lateral portion L1 of the first die 110 may be a first peripheral portion of the first die 110. The first via structure 112 may extend between the first surface 110a of the first die 110 and the first surface 108a of the molding compound 108. Only two first via structures 112 are shown as an example, however, the number of first via structures 112 at the first lateral portion L1 of the first die 110 may be less than two (e.g. one) or may be more than two (e.g. three, four, or more), in accordance with some embodiments. The first via structure 112 may include similar materials as the plurality of contact pads 110c.

The first via structure 112 may be electrically coupled or electrically connected to the first RDL 110d of the first die 110. Consequently, the first via structure 112 may also be electrically coupled or electrically connected to the plurality of contact pads 110c of the first die 110.

The first chip package 102 may include a second via structure 114 within the molding compound 108 at a second lateral portion L2 of the first die 110 opposite the first lateral portion L1. The second lateral portion L2 of the first die 110 may be a second peripheral portion of the first die 110 opposite the above-mentioned first peripheral portion. The second via structure 114 may extend between the first surface 110a of the first die 110 and the first surface 108a of the molding compound 108. Only two second via structures 114 are shown as an example, however, the number of second via structures 114 at the second lateral portion L2 of the first die 110 may be less than two (e.g. one) or may be more than two (e.g. three, four, or more), in accordance with some embodiments. The second via structure 114 may include similar materials as the plurality of contact pads 110c.

The second via structure 114 may be electrically coupled or electrically connected to the first RDL 110d of the first die 110. Consequently, the second via structure 114 may also be electrically coupled or electrically connected to the plurality of contact pads 110c of the first die 110.

The first chip package 102 may include a second die 116, which may be disposed over the first die 110. The second die 116 may be a die that may have been singulated from a wafer including a plurality of dies. The second die 116 may be used in one or more applications. For example, in an embodiment, the second die 116 may be used in microelectromechanical systems (MEMS), logic, memory, power, analog or RF communications applications, although other applications may be possible as well in accordance with other embodiments. As an example, in a logic and memory application, the second die 116 may include a logic chip, a memory chip or stacked memory chips, and the like. As an example, the second die 116 may include a random access memory chip (e.g. high speed synchronous dynamic random access memory (SRAM) chip) and/or a wide input-output (I/O) memory chip (e.g. a wide I/O DRAM). As a further example, the second die 116 may be an application-specific integrated circuit (ASIC).

The second die 116 may have a first surface 116a and a second surface 116b opposite the first surface 116a. The first surface 116a of the second die 116 may be an active surface of the second die 116. The first surface 116a of the second die 116 may face the first surface 110a of the first die 110, as shown in FIG. 1A. In an embodiment where the first surface 116a of the second die 116 and the first surface 110a of the first die 110 are active surfaces, the arrangement of the first die 110 and the second die 116 as shown in FIG. 1A may be a face-to-face arrangement.

The second die 116 may include a plurality of contact pads (not shown in FIG. 1A) disposed at (e.g. disposed on or over) the first surface 116a. The second die 116 may additionally include RDLs, passivation layers, dielectric layers, and under bump metallization (UBM) layers disposed at (e.g. disposed on or over) the first surface 116a of the second die 116. These features of the second die 116 are not shown in FIG. 1A for the sake of simplicity.

As shown in FIG. 1A, the second die 116 may be disposed within the molding compound 108, between the first via structure 112 and the second via structure 114. For example, the first via structure 112 may be disposed laterally adjacent to and spaced apart from a first sidewall 116c of the second die 116, while the second via structure 114 may be disposed laterally adjacent to and spaced apart from a second sidewall 116d of the second die 116 opposite the first sidewall 116c. The molding compound 108 may cover the first surface 116a, the first sidewall 116c, and the second sidewall 116d of the second die 116, as shown in FIG. 1A.

The first chip package 102 may include a second plurality of connectors 118 disposed between the first die 110 and the second die 116. The second plurality of connectors 118 may electrically couple or electrically connect the first die 110 and the second die 116 to each other. As an example, the second plurality of connectors 118 may be coupled or connected to the plurality of contact pads 110c of the first die 110, as shown in FIG. 1A. The second plurality of connectors 118 may additionally be coupled or connected to the plurality of contact pads of the second die 116 (not shown in FIG. 1A). The second plurality of connectors 118 may include similar materials as the first plurality of connectors 106.

The first chip package 102 may include a second RDL 120 disposed at (e.g. disposed on or over) the first surface 108a of the molding compound 108. As shown in FIG. 1A, the second RDL 120 may additionally be disposed at (e.g. disposed on or over) the second surface 116b of the second die 116. The second RDL 120 may be electrically coupled or electrically connected to the first via structure 112 and the second via structure 114. The second RDL 120 may include similar materials as the first RDL 110d.

The first chip package 102 may include a first substrate 122 disposed over the second RDL 120. In other words, the second RDL 120 may be disposed between the first substrate 122 and the second die 116 or between the first substrate 122 and the first surface 108a of the molding compound 108, as shown in FIG. 1A. The first substrate 122 may be referred to as a front-side substrate. The first substrate 122 may include conductive structures 122r (e.g. RDLs and/or UBMs) that may be partially or fully disposed within an insulating layer 122d (e.g. a dielectric layer). The conductive structures 122r of the first substrate 122 may be electrically coupled or electrically connected to the second RDL 120 and the first plurality of connectors 106. The conductive structures 122r of the first substrate 122 may redistribute and/or re-map electrical connections between the second RDL 120 and the first plurality of connectors 106. The conductive structures 122r may include similar materials as the first RDL 110d.

As a result of the electrical couplings and electrical connections described above, the first plurality of connectors 106 may be electrically coupled or electrically connected to the first die 110 through the conductive structures 122r of the first substrate 122, the second RDL 120, the first and second via structures 112 and 114, the first RDL 110d, and the plurality of contact pads 110c. In other words, an electrical path between the first plurality of connectors 106 and the first die 110 may include the conductive structures 122r of the first substrate 122, the second RDL 120, the first and second via structures 112 and 114, the first RDL 110d, and the plurality of contact pads 110c. Furthermore, the first plurality of connectors 106 may be electrically coupled or electrically connected to the second die 116 through the conductive structures 122r of the first substrate 122, the second RDL 120, the first and second via structures 112 and 114, the first RDL 110d, and the second plurality of connectors 118. In other words, an electrical path between the first plurality of connectors 106 and the second die 116 may include the conductive structures 122r of the first substrate, the second RDL 120, the first and second via structures 112 and 114, the first RDL 110d, and the second plurality of connectors 118.

The first chip package 102 may further include a second substrate 124 disposed at the second surface 108b of the molding compound 108. As shown in FIG. 1A, the second surface 110b of the first die 110 may face the second substrate 124. The first die 110 may be attached or secured to the second substrate 124 by an adhesive layer 127. In other words, the adhesive layer 127 may be disposed between the second substrate 124 and the first die 110, as shown in FIG. 1A. The adhesive layer 127 may include glue, a polymer material, a die attach film (DAF), and the like.

The second substrate 124 may be referred to as a back-side substrate. In an embodiment, the second substrate 124 may include conductive structures 124r (e.g. RDLs and/or UBMs) that may be partially or fully disposed within an insulating layer 124d (e.g. a dielectric layer). The conductive structures 124r may include similar materials as the first RDL 110d. However, in another embodiment, the second substrate 124 may include a semiconductor substrate. The semiconductor substrate may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof. By way of yet another example, the second substrate 124 may include FR4 and/or bis-maleimi-detriazine (BT). In such an example, the second substrate 124 may include spin coated dielectric materials and RDLs and/or organic substrate with lamination of copper foils, dielectric film on a BT and/or FR4 core.

The first chip package 102 may include a third plurality of connectors 126 disposed at a side of the second substrate 124 opposite the first die 110. The third plurality of connectors 126 may be electrically coupled or electrically connected to the conductive structures 124r of the second substrate 124. The third plurality of connectors 126 may be used to connect to a customer board, a printed circuit board, or an interposer board that may, for example, be used in an end-user application. Only five connectors 126 are shown as an example, however, the number of connectors 126 may be less than five (e.g. one, two, three, or four) or may be more than five (e.g. six, seven, or more), in accordance with some embodiments. In the example shown in FIG. 1A, the third plurality of connectors 126 have a spherical shape (e.g. balls). However, in another embodiment the third plurality of connectors 126 may have another shape, e.g. pillars, posts, bumps, or caps. In an embodiment, the third plurality of connectors 126 may include a ball grid array (BGA). In such an embodiment, the third plurality of connectors 126 may be referred to as a back-side BGA. The third plurality of connectors may include similar materials as the first plurality of connectors 106.

The first chip package 102 may include a third RDL 128 at the second surface 108b of the molding compound 108. For example, the third RDL 128 may be disposed between the second surface 108b of the molding compound 108 and the second substrate 124. The conductive structures 124r of the second substrate 124 may be electrically coupled or electrically connected to the third RDL 128 and the third plurality of connectors 126. The conductive structures 124r of the second substrate 124 may redistribute and/or re-map electrical connections between the third RDL 128 and the third plurality of connectors 126.

The first chip package 102 may include a third via structure 130 within the molding compound 108 laterally adjacent to and spaced apart from the first sidewall 110e of the first die 110. The third via structure 130 may extend between the first surface 108a of the molding compound 108 and the second surface 108b of the molding compound 108. Only two third via structures 130 are shown as an example, however, the number of third via structures 130 laterally adjacent to the first sidewall 110e of the first die 110 may be less than two (e.g. one) or may be more than two (e.g. three, four, or more), in accordance with some embodiments. The third via structure 130 may include similar materials as the plurality of contact pads 110c. The third via structure 130 may be electrically coupled or electrically connected to the second RDL 120 (e.g. at the first surface 108a of the molding compound 108) and the third RDL 128 (e.g. at the second surface 108b of the molding compound 108).

The first chip package 102 may include a fourth via structure 132 within the molding compound 108 laterally adjacent to and spaced apart from the second sidewall 110f of the first die 110. The fourth via structure 132 may extend between the first surface 108a of the molding compound 108 and the second surface 108b of the molding compound 108. Only two fourth via structures 132 are shown as an example, however, the number of fourth via structures 132 laterally adjacent to the second sidewall 110f of the first die 110 may be less than two (e.g. one) or may be more than two (e.g. three, four, or more), in accordance with some embodiments. The fourth via structure 132 may include similar materials as the plurality of contact pads 110c. The fourth via structure 132 may be electrically coupled or electrically connected to the second RDL 120 (e.g. at the first surface 108a of the molding compound 108) and the third RDL 128 (e.g. at the second surface 108b of the molding compound 108).

As a result of the electrical couplings and electrical connections described above, the first plurality of connectors 106 may be electrically coupled or electrically connected to the third plurality of connectors 126 through the conductive structures 122r of the first substrate 122, the second RDL 120, the third and fourth via structures 130 and 132, the third RDL 128, and the conductive structures 124r of the second substrate 124. In other words, an electrical path between the first plurality of connectors 106 and the third plurality of connectors 126 may include the conductive structures 122r of the first substrate 122, the second RDL 120, the third and fourth via structures 130 and 132, the third RDL 128, and the conductive structures 124r of the second substrate 124.

As a result of the electrical couplings and electrical connections described above, the third plurality of connectors 126 may be electrically coupled or electrically connected to the first die 110 through the conductive structures 124r of the second substrate 124, the third RDL 128, the third and fourth via structures 130 and 132, the second RDL 120, the first and second via structures 112 and 114, the first RDL 110d, and the plurality of contact pads 110c. In other words, an electrical path between the third plurality of connectors 126 and the first die 110 may include the conductive structures 124r of the second substrate 124, the third RDL 128, the third and fourth via structures 130 and 132, the second RDL 120, the first and second via structures 112 and 114, the first RDL 110d, and the plurality of contact pads 110c.

As a result of the electrical couplings and electrical connections described above, the third plurality of connectors 126 may be electrically coupled or electrically connected to the second die 116 through the conductive structures 124r of the second substrate 124, the third RDL 128, the third and fourth via structures 130 and 132, the second RDL 120, the first and second via structures 112 and 114, the first RDL 110d, and the second plurality of connectors 118. In other words, an electrical path between the third plurality of connectors 126 and the second die 116 may include the conductive structures 124r of the second substrate 124, the third RDL 128, the third and fourth via structures 130 and 132, the second RDL 120, the first and second via structures 112 and 114, the first RDL 110d, and the second plurality of connectors 118.

The second chip package 104 disposed over the first chip package 102 may include at least one third die 134. The at least one third die 134 may be a die that may have been singulated from a wafer including a plurality of dies. The at least one third die 134 may be used in one or more applications. For example, in an embodiment, the at least one third die 134 may be used in microelectromechanical systems (MEMS), logic, memory, analog, power or RF communications applications, although other applications may be possible as well in accordance with other embodiments. As an example, in a logic and memory application, the at least one third die 134 may include a memory chip, examples of which include a dynamic random access memory chip, a wide I/O DRAM chip, a flash memory chip, a hybrid of (e.g. a combination of) a low power double data rate (LPDDR) chip and a flash memory chip, a LPDDR memory 3/4 die, and the like. In an example of such an embodiment, the second chip package 104 may be an LPDDR 3/4 package, a wide I/O chip or a wide I/O chip package. As a further example, the at least one third die 134 may be a die that can provide RF connectivity, e.g. to the underlying first chip package 102.

The second chip package 104 may include a third substrate 138 including conductive structures (e.g. RDLs and/or UBMs) (not shown in FIG. 1A) that may be partially or fully disposed within an insulating layer (e.g. a dielectric layer). The at least one third die 134 may be encapsulated in an encapsulant 136 and may be electrically connected or electrically coupled to the conductive structures of the third substrate 138 by a fourth plurality of connectors 140. In the embodiment shown in FIG. 1A, the fourth plurality of connectors 140 may be a wirebond connection. However, in another embodiment, the fourth plurality of connectors 140 may be other types of connectors (e.g. flip chip bumps, RDLs, via structures, and the like).

Several advantages and effects are provided by the package 100 shown in FIG. 1A. For example, in an embodiment where the first die 110 is a logic die and where the second die 116 is an SRAM and/or wide I/O DRAM die, the arrangement shown in the package 100 allows for face-to-face bonding and molding of the first die 110 and the second die 116. Furthermore, in an embodiment where the second chip package 104 is an LPDDR 3/4 package, the first via structure 112 and the second via structure 114 allow for communication (e.g. electrical communication) with the LPDDR 3/4 package. Even further, the use of through-silicon vias (TSVs) for fan-out purposes is circumvented or prevented by the use of the first via structure 112, the second via structure 114, the third via structure 130, and the fourth via structure 132, which are disposed within the molding compound 108. This in turn, can help to decrease a cost of manufacturing the first chip package 102 and/or the package 100 as well as increase reliability of the first chip package 102 and/or the package 100.

In the embodiment shown in FIG. 1A, the molding compound 108 is disposed in a space between the first surface 116a of the second die 116 and the first surface 110a of the first die. However, as shown in the embodiment of FIG. 1B, the package 100 may include an underfill layer 142 disposed in the space between the first surface 116a of the second die 116 and the first surface 110a of the first die 110. The underfill layer 142 may include a non-conductive film or a polymer material, in accordance with some embodiments. The underfill layer 142 may be formed by at least one of capillary dispensing, jetting of a liquid underfill material where a fillet of underfill material forms around a perimeter or periphery of second die 116 (e.g. as shown in FIG. 1B), and lamination of a non-conductive film where a fillet of underfill material is not formed around the perimeter or periphery of second die 116. In the example of lamination, the underfill layer 142 may be disposed between the first surface 116a of the second die 116 and the first surface 110a of the first die 110, while the first and second sidewalls 116c, 116d of the second die 116 are substantially free from the underfill layer 142 (e.g. as shown in FIG. 1D).

In the embodiment shown in FIG. 1A, the first surface 108a of the molding compound 108 is substantially co-planar with the second surface 116b of the second die 116. However, as shown in the embodiment of FIG. 1C, the molding compound 108 may cover the second surface 116b of the second die 116. Consequently, the second RDL 120 may be disposed entirely over the first surface 108a of the molding compound 108 and may be additionally disposed over (e.g. disposed above) the second surface 116b of the second die 116. In the embodiment shown in FIG. 1C, the second die 116 may be fully encapsulated by the molding compound 108, thus providing the second die 116 with more protection (e.g. physical protection). Although the embodiment shown in FIG. 1C shows that the molding compound 108 is disposed in the space between the first surface 116a of the second die 116 and the first surface 110a of the first die, in another embodiment, the underfill layer 142 may be disposed in this space.

In the embodiments shown in FIG. 1A to FIG. 1C, the second die 116 may be disposed over the first die 110, and thus, the second die 116 may be closer to the second chip package 104 than the first die 110. In these embodiment, the electrical path between the third plurality of connectors 126 and the first die 110 may include the conductive structures 124r of the second substrate 124, the third RDL 128, the third and fourth via structures 130 and 132, the second RDL 120, the first and second via structures 112 and 114, the first RDL 110d, and the plurality of contact pads 110c. This electrical path may be shortened, as shown in the embodiment of FIG. 1D. For example, in the package 100 shown in FIG. 1D, the first die 110 may be disposed over the second die 116, and thus, the first die 110 may be closer to the second chip package 104 than the second die 116. Furthermore, the first substrate 122 and the second RDL 120 may not be included in the package 100 of FIG. 1D. Instead, the second surface 110b of the first die 110 may be substantially co-planar with the first surface 108a of the molding compound 108. Furthermore, the second surface 110b of the first die 110 may be exposed, thus improving the thermal performance of the first die 110 since the second surface 110b of the first die 110 may dissipate heat generated in the first die 110 more readily and easily than in the embodiments shown in FIG. 1A to FIG. 1C.

In the embodiment shown in FIG. 1D, the first via structure 112 and the second via structure 114 may extend between the first surface 110a of the first die 110 and the third RDL 128. Additionally, the first plurality of connectors 106 may be positioned to coincide with locations of the third via structure 130 and the fourth via structure 132. The first plurality of connectors 106 may be electrically connected or electrically coupled with the third via structure 130 and the fourth via structure 132. As a result, the electrical path between the third plurality of connectors 126 and the first die 110 may include the conductive structures 124r of the second substrate 124, the third RDL 128, the first and second via structures 112 and 114, the first RDL 110d, and the plurality of contact pads 110c. This electrical path between the third plurality of connectors 126 and the first die 110 is shorter than those shown in the embodiments of FIG. 1A to FIG. 1C.

Furthermore, the electrical path between the third plurality of connectors 126 and the second die 116 is also shortened. For example, in embodiments shown in FIG. 1A to FIG. 1C, the electrical path between the third plurality of connectors 126 and the second die 116 may include the conductive structures 124r of the second substrate 124, the third RDL 128, the third and fourth via structures 130 and 132, the second RDL 120, the first and second via structures 112 and 114, the first RDL 110d, and the second plurality of connectors 118. However, in the embodiment shown in FIG. 1D, the electrical path between the third plurality of connectors 126 and the second die 116 includes the conductive structures 124r of the second substrate 124, the third RDL 128, the first and second via structures 112 and 114, the first RDL 110d, and the second plurality of connectors 118. Although the embodiment shown in FIG. 1D shows that the underfill layer 142 is disposed in the space between the first surface 116a of the second die 116 and the first surface 110a of the first die, in another embodiment, the molding compound 108 may be disposed in this space.

An added advantage provided by the package 100 shown in FIG. 1D is provision of a shorter wiring length for heterogeneous chip integration, which would allow for high memory bandwidth and high capacity. This also may result in low power consumption of the package 100 shown in FIG. 1D, thus allowing the package 100 shown in FIG. 1D to be used in a variety of applications, such as an internet-of-things (IoT) and wearable electronics, as examples.

The embodiments shown in FIG. 1A to FIG. 1D, the electrical coupling or electrical connection between the first substrate 122 and the second substrate 124 are made through the third via structure 130 and the fourth via structure 132. However, as shown in the embodiment of FIG. 1E, the electrical coupling or electrical connection between the first substrate 122 and the second substrate 124 may be made through another conductive structure (e.g. a first wirebond structure 144 and a second wirebond structure 146). For example, the first wirebond structure 144 and the second wirebond structure 146 may be electrically connected or electrically coupled to the conductive structures 122r of the first substrate 122 and to the conductive structures 124r of the second substrate 124.

As shown in the embodiment of FIG. 1E, the first wirebond structure 144 and the second wirebond structure 146 may extend from a surface of the first substrate 122 facing the second chip package 104 to a surface of the second substrate 124 facing the second chip package 104. Only one first wirebond structure 144 is shown as an example, however, the number of first wirebond structures 144 may be more than one (e.g. two, three, four, or more), in accordance with some embodiments. In like manner, only one second wirebond structure 146 is shown as an example, however, the number of second wirebond structures 146 may be more than one (e.g. two, three, four, or more), in accordance with some embodiments. The first wirebond structure 144 and the second wirebond structure 146 may include similar materials as the plurality of contact pads 110c and/or gold, copper, silver, aluminum, an alloy containing copper and palladium, and the like.

As shown in FIG. 1E, the first wirebond structure 144 may be disposed laterally adjacent to and spaced apart from the first sidewall 110e of the first die 110, while the second wirebond structure 146 may be disposed laterally adjacent to and spaced apart from the second sidewall 110f of the first die 110. The first wirebond structure 144 and the second wirebond structure 146 may be entirely encapsulated in the molding compound 108, as shown in FIG. 1E. As a result of this, and since the first wirebond structure 144 and the second wirebond structure 146 may extend from the surface of the first substrate 122 facing the second chip package 104 to the surface of the second substrate 124 facing the second chip package 104, the molding compound 108 may encapsulate lateral regions of the first substrate 122, as shown in FIG. 1E. In other words, unlike the embodiments shown in FIG. 1A to FIG. 1C, the first surface 108a of the molding compound 108 may be located closer to the second chip package 104 than the surface of the first substrate 122 facing the second chip package 104. As shown in the embodiment of FIG. 1E, this may be effected by having a lateral extent of the first substrate 122 being smaller than a lateral extent of the second substrate 124. As shown in FIG. 1E, the first plurality of connectors 106 may be encompassed or encircled by a portion of the molding compound 108. Although the embodiment shown in FIG. 1E shows that the underfill layer 142 is disposed in the space between the first surface 116a of the second die 116 and the first surface 110a of the first die, in another embodiment, the molding compound 108 may be disposed in this space.

In the embodiments shown in FIG. 1A to FIG. 1E, the package 100 includes the first chip package 102 and the second chip package 104 disposed thereon. However, in another embodiment (e.g. as shown in FIG. 1F), the package 100 may include the first chip package 102 and an overlying chip 150 disposed over the first chip package 102. The overlying chip 150 may be a die that may have been singulated from a wafer including a plurality of dies. The overlying chip 150 may be used in one or more applications. For example, in an embodiment, the overlying chip 150 may be used in microelectromechanical systems (MEMS), logic, memory, power, analog or RF communications applications, although other applications may be possible as well in accordance with other embodiments. The overlying chip 150 may include contact pads, an RDL, passivation layers, dielectric layers, and under bump metallization (UBM) layers disposed at (e.g. disposed on or over) the surface of the overlying chip 150 facing the first chip package 102. These features of the overlying chip 150 are not shown in FIG. 1F for the sake of simplicity. In the embodiment of FIG. 1F, the first plurality of connectors 106 may include micro-bumps and/or C4 bumps that electrically connect the overlying chip 150 to the first chip package 102 (e.g. by means of electrically connecting the first plurality of connectors 106 to the conductive structures 122r of the first substrate 122).

In another embodiment of the package 100 (shown in FIG. 1G), the overlying chip 150 and the second chip package 104 may both be disposed over the first chip package 102. In such an embodiment, the first plurality of connectors 106 may include a first group of connectors 106-1 and a second group of connectors 106-2. The first group of connectors 106-1 may electrically connect the second chip package 104 to the first chip package 102 (e.g. by means of electrically connecting the first group of connectors 106-1 to the conductive structures 122r of the first substrate 122). The first group of connectors 106-1 may be a top-side BGA. The second group of connectors 106-2 may electrically connect the overlying chip 150 to the first chip package 102 (e.g. by means of electrically connecting the second group of connectors 106-2 to the conductive structures 122r of the first substrate 122). The second group of connectors 106-2 may be C4 bumps and/or micro bumps.

Figure 1G:
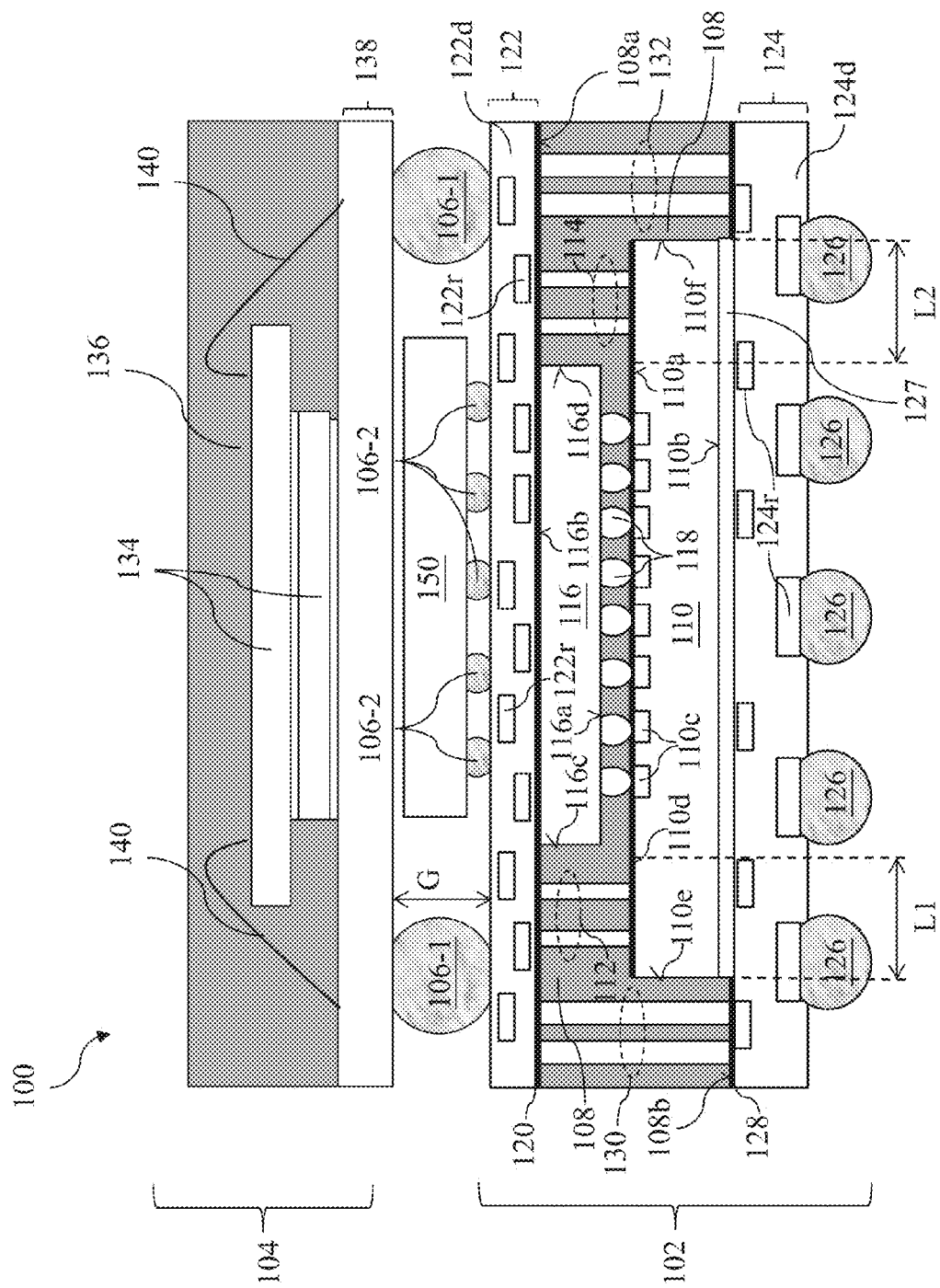

As shown in FIG. 1G, there may be a standoff gap G between the second chip package 104 and the first chip package 102, e.g. as a result of the first group of connectors 106-1. As a result, if the total height of the overlying chip 150 and the second group of connectors 106-2 is smaller than the standoff gap G, the overlying chip 150 and the second group of connectors 106-2 may be disposed within the standoff gap G and over the first chip package 102. As shown in FIG. 1G, the first group of connectors 106-1 may be disposed laterally adjacent to and spaced apart from the overlying chip 150, and may surrounded at least a portion of the overlying chip 150. The overlying chip 150 may also be electrically connected to the second chip package 104. For example, an electrical path including the second group of connectors 160-2, the conductive structures 122r of the first substrate 122, and the first group of connectors 160-1 may electrically connect the overlying chip 150 to the second chip package 104. Following from the embodiments shown in FIG. 1A to FIG. 1G, the overlying chip 150 and/or the second chip package 104 overlying the first chip package 102 may also be referred to as a die structure.

In the embodiments of FIG. 1A to FIG. 1G, the first plurality of connectors 106 and the third plurality of connectors 126 may be electrically coupled or electrically connected to the first die 110 and the second die 116 through at least one of the first via structure 112, the second via structure 114, the third via structure 130, and the fourth via structure 132. However, as shown in the embodiments of FIG. 1H to FIG. 1J, the package 100 may exclude some of the aforementioned via structures and instead, the first die 110 and/or the second die 116 may include at least one through-silicon via (TSV) that may provide the electrical connection between the first plurality of connectors 106 and each of the first die 110 and the second die 116 and/or the electrical connection between the third plurality of connectors 126 and each of the first die 110 and the second die 116.

Figure 1H:
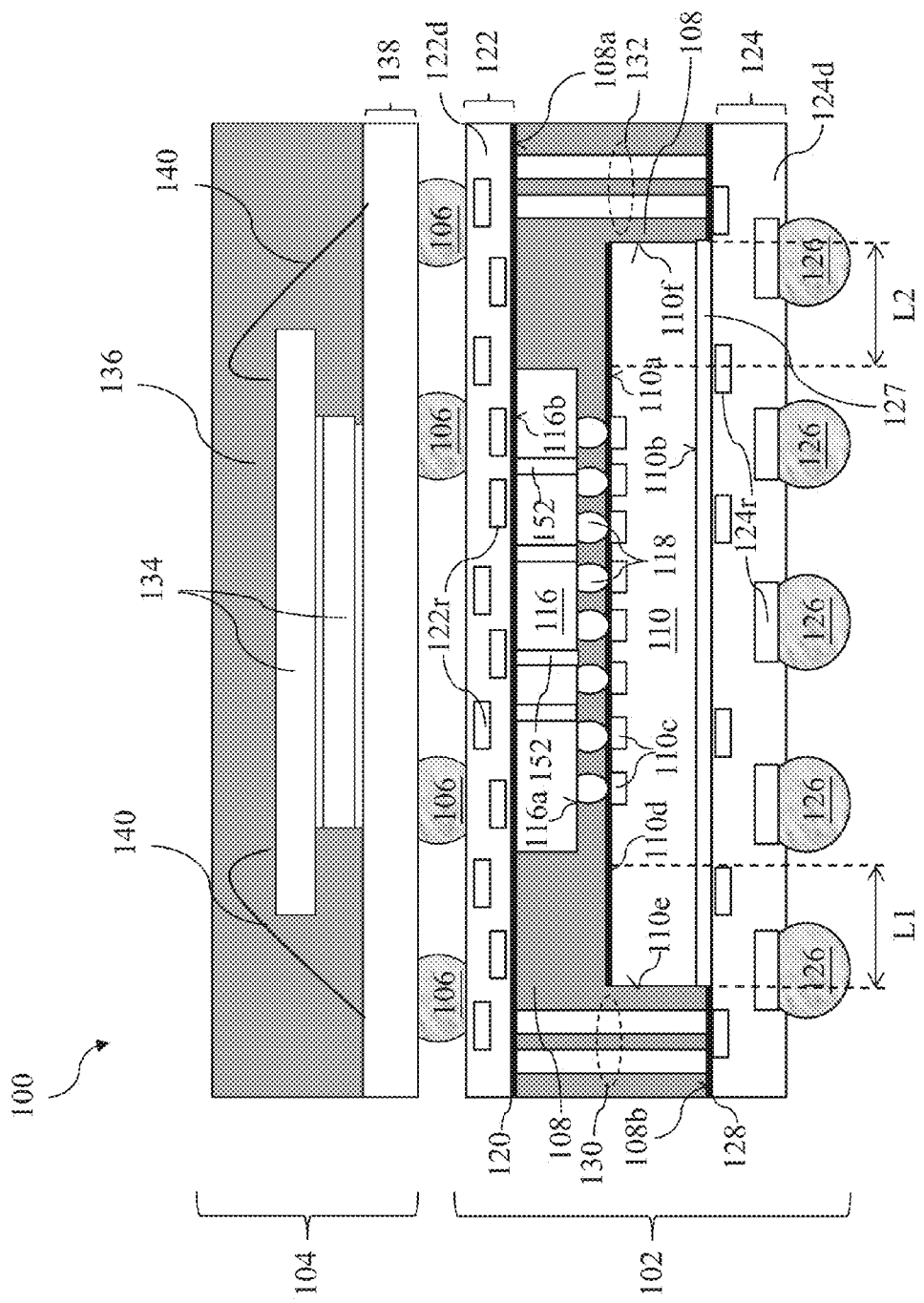
Figure 1J:
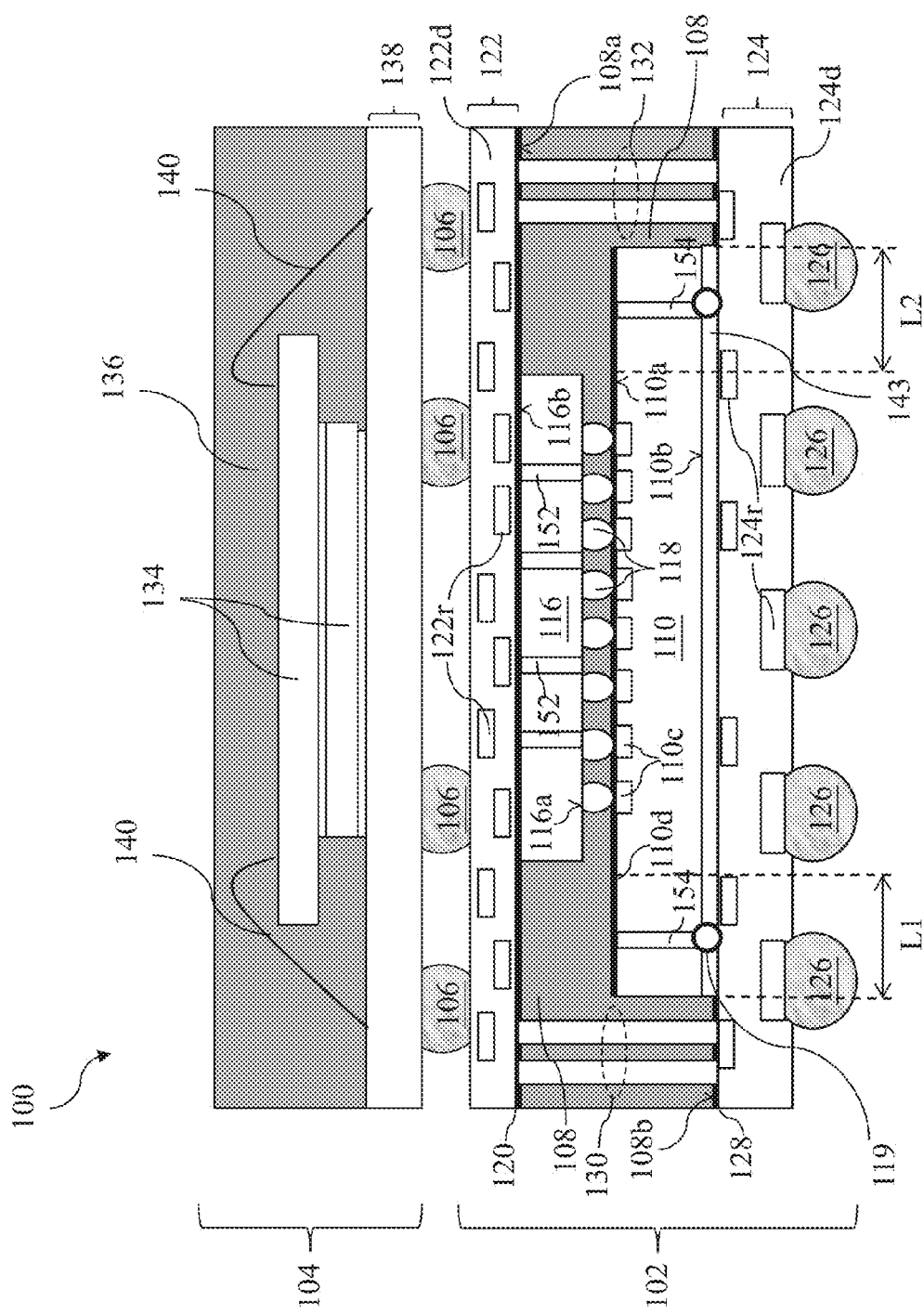

For example, in FIG. 1H, the second die 116 may include at least one TSV 152 that may extend between the first surface 116a and the second surface 116b of the second die 116. Only four TSVs 152 are shown as an example, however, the number of TSVs 152 may be less than four (e.g. one, two, or three) or may be more than four (e.g. five, six, seven, or more), in accordance with some embodiments. The at least one TSV 152 of the second die 116 may be filled with a conductive material (e.g. gold, copper, silver, aluminum, an alloy containing copper and palladium, and the like). As a result of the at least one TSV 152 of the second die 116, the first via structure 112 and the second via structure 114 may be excluded from the package 100.

In the embodiment shown in FIG. 1H, the first plurality of connectors 106 and the first die 110 may be electrically connected through an electrical path that includes the conductive structures 122*r* of the first substrate 122, the second RDL 120, the TSVs 152 of the second die 116, the second plurality of connectors 118, the first RDL 110*d*, and the contact pads 110*c*. Meanwhile, the first plurality of connectors 106 and the second die 116 may be electrically connected through an electrical path that includes the conductive structures 122*r* of the first substrate 122, the second RDL 120, and the TSVs 152 of the second die 116. Similarly, the third plurality of connectors 126 and the first die 110 may be electrically connected through an electrical path that includes the conductive structures 124*r* of the second substrate 124, the third RDL 128, the third and fourth via structures 130 and 132, the second RDL 120, the TSVs 152 of the second die 116, the second plurality of connectors 118, the first RDL 110*d*, and the contact pads 110*c*. Finally, the third plurality of connectors 126 and the second die 116 may be electrically connected through an electrical path that includes the conductive structures 124*r* of the second substrate 124, the third RDL 128, the third and fourth via structures 130 and 132, the second RDL 120, and the TSVs 152 of the second die 116. In comparison to some of the embodiments shown in FIG. 1A to FIG. 1G, the electrical path in FIG. 1H between the first plurality of connectors 106 and each of the first die 110 and the second die 116 is shorter. Also, the electrical path in FIG. 1H between the third plurality of connectors 126 and each of the first die 110 and the second die 116 is also shorter compared to some of the embodiments of FIG. 1A to FIG. 1G. This in turn, enables higher memory bandwidth and higher capacity than the embodiments of FIG. 1A to FIG. 1G.

As a further example, in FIG. 1I, the first die 110 may include at least one TSV 154 that may extend between the first surface 110*a* and the second surface 110*b* of the first die 110. Only two TSVs 154 are shown as an example, however, the number of TSVs 154 may be less than two (e.g. one) or may be more than two (e.g. three, four, five, or more), in accordance with some embodiments. The at least one TSV 154 of the first die 110 may be filled with a conductive material (e.g. gold, copper, silver, aluminum, an alloy containing copper and palladium, and the like). As a result of the at least one TSV 154 of the first die 110, the third via structure 130 and the fourth via structure 132 may be optionally excluded from the package 100.

In the example of FIG. 1I, the package 100 may include a fifth plurality of connectors 119 disposed at the second surface 110*b* of the first die 110. The fifth plurality of connectors 119 may include C4 bumps and/or micro bumps (e.g. as shown in FIG. 1I) and may electrically connect the first die 110 and the third RDL 128 to each other, e.g. at the second surface 110*b* of the first die 110. The fifth plurality of connectors 119 may include similar materials as the first plurality of connectors 106. In the example of FIG. 1I, the adhesive layer 127 may be replaced by a second underfill layer 143, which may include similar materials as the underfill layer 142. As shown in FIG. 1I, the fifth plurality of connectors 119 may be disposed within the second underfill layer 143.

In the embodiment shown in FIG. 1I, the first plurality of connectors 106 and the first die 110 may be electrically connected through an electrical path that includes the conductive structures 122*r* of the first substrate 122, the second RDL 120, the first and second via structures 112 and 114, the first RDL 110*d*, and the contact pads 110*c*. Meanwhile, the first plurality of connectors 106 and the second die 116 may be electrically connected through an electrical path that includes the conductive structures 122*r* of the first substrate 122, the second RDL 120, the first and second via structures 112 and 114, the first RDL 110*d*, and the second plurality of connectors 118. Similarly, the third plurality of connectors 126 and the first die 110 may be electrically connected through an electrical path that includes the conductive structures 124*r* of the second substrate 124, the third RDL 128, the fifth plurality of connectors 119, the TSVs 154 of the first die 110, the first RDL 110*d*, and the contact pads 110*c*. Finally, the third plurality of connectors 126 and the second die 116 may be electrically connected through an electrical path that includes the conductive structures 124*r* of the second substrate 124, the third RDL 128, the fifth plurality of connectors 119, the TSVs 154 of the first die 110, the first RDL 110*d*, and second plurality of connectors 118. In comparison to some of the embodiments shown in FIG. 1A to FIG. 1G, the electrical path in FIG. 1I between the first plurality of connectors 106 and each of the first die 110 and the second die 116 is shorter. Also, the electrical path in FIG. 1I between the third plurality of connectors 126 and each of the first die 110 and the second die 116 is also shorter compared to some of the embodiments of FIG. 1A to FIG. 1G. This in turn, enables higher memory bandwidth and higher capacity than the embodiments of FIG. 1A to FIG. 1G.

As yet another example, in FIG. 1J, the first die 110 and the second die 116 may each include at least one TSV 154 and 152, respectively. As a result of the at least one TSV 154 of the first die 110 and the at least one TSV 152 of the second die 116, the first, second, third, and fourth via structures 112, 114, 130, and 132 may be optionally excluded from the package 100. In some embodiments, the third via structure 130 and the fourth via structure 132 may be included as an extra or additional thermal dissipation path and/or as power or ground vias, and the like due to its larger via dimensions. Consequently, in the embodiment of FIG. 1J where the first die 110 and the second die 116 may each include the TSVs 154 and 152, the third via structure 130 and the fourth via structure 132 may be included for purposes other than signaling or conducting a signal from one feature of the package 100 to another.

In the embodiment shown in FIG. 1J, the first plurality of connectors 106 and the first die 110 may be electrically connected through an electrical path that includes the conductive structures 122*r* of the first substrate 122, the second RDL 120, the TSVs 152 of the second die 116, the second plurality of connectors 118, and the contact pads 110*c*. Meanwhile, the first plurality of connectors 106 and the second die 116 may be electrically connected through an electrical path that the conductive structures 122*r* of the first substrate 122, the second RDL 120, and the TSVs 152 of the second die 116. Similarly, the third plurality of connectors 126 and the first die 110 may be electrically connected through an electrical path that includes the conductive structures 124*r* of the second substrate 124, the third RDL 128, the fifth plurality of connectors 119, the TSVs 154 of the first die 110, the first RDL 110*d*, and the contact pads 110*c*. Finally, the third plurality of connectors 126 and the second die 116 may be electrically connected through an electrical path that includes the conductive structures 124*r* of the second substrate 124, the third RDL 128, the fifth plurality of connectors 119, the TSVs 154 of the first die 110, the first RDL 110*d*, and second plurality of connectors 118. In comparison to some of the embodiments shown in FIG. 1A to FIG. 1G, the electrical path in FIG. 1J between the first plurality of connectors 106 and each of the first die 110 and the second die 116 is shorter. Also, the electrical path in FIG. 1J between the third plurality of connectors 126 and each of the first die 110 and the second die 116 is also shorter compared to some of the embodiments of FIG. 1A to FIG. 1G. This in turn, enables higher memory bandwidth and higher capacity than the embodiments of FIG. 1A to FIG. 1G. It is noted that an embodiment shown in FIG. 1A to FIG. 1J may be combined with another embodiment shown in FIG. 1A to FIG. 1J to form further embodiments of the package 100. All embodiment features from FIG. 1F to FIG. 1J may be readily extended to the embodiment of FIG. 1D, where the first die 110 may be disposed over the second die 116, and thus, the first die 110 may be closer to the second chip package 104 than the second die 116.

FIGS. 2A to 2M show a process flow illustrating a method of manufacturing the package 100, in accordance with one or more embodiments. The process flow shown in FIG. 2A to FIG. 2M may, for example, be used to manufacture the packages 100 shown in FIG. 1A.

Figure 2A:
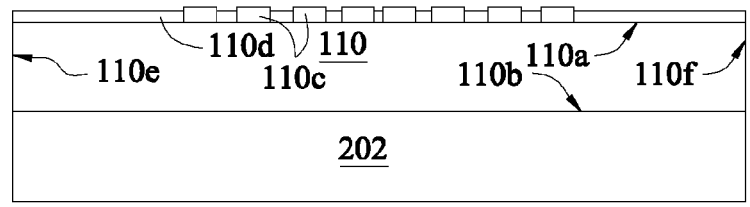
FIGS. 2A to 2M show a process flow illustrating a method of manufacturing a package, in accordance with some embodiments.

As shown in FIG. 2A, the first die 110 may be provided. The first die 110 may have the first RDL 110d and the plurality of contact pads 110c formed at the first surface 110a. Methods of forming contact pads and an RDL on a surface of a chip are known in the art and are not described here for the sake of brevity. The first die 110 may be bonded to a first carrier 202. Generally, the first carrier 202 provides temporary mechanical and structural support to the first die 110 during subsequent processing steps. In this manner, damage to the first die 110 is reduced or prevented. The first carrier 202 may include, for example, glass, silicon, silicon oxide, aluminum oxide, and the like. In an embodiment, an adhesive (not shown in FIG. 2A) may be used to attach the first die 110 to the first carrier 202. The adhesive may be any suitable adhesive, such as an ultraviolet (UV) glue, which loses its adhesive property when exposed to UV lights and/or a thermal release glue, which may lose its adhesive property when heated beyond a certain temperature. In another embodiment, a die attachment film (DAF) may be used to attach the first die 110 to the first carrier 202.

Figure 2B:
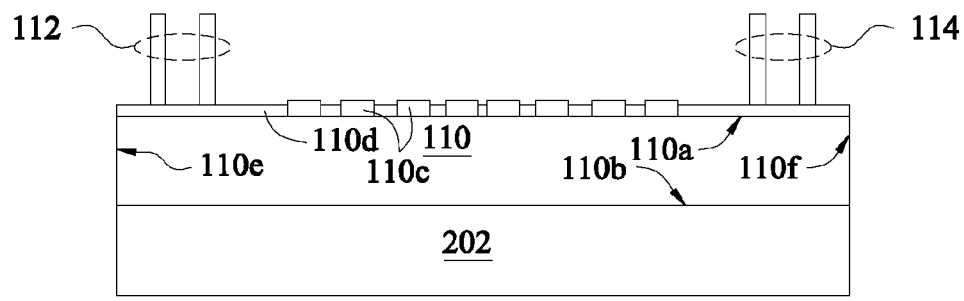

As shown in FIG. 2B, the first via structure 112 and the second via structure 114 are formed at the first surface 110a of the first die 110 at the first lateral portion L1 and the second lateral portion L2 of the first die, respectively. The first via structure 112 and the second via structure 114 may be formed by any suitable techniques such as electroplating. Other processes of formation such as sputtering, evaporation, PECVD and/or the like may alternatively be used depending upon the desired materials.

Figure 2C:
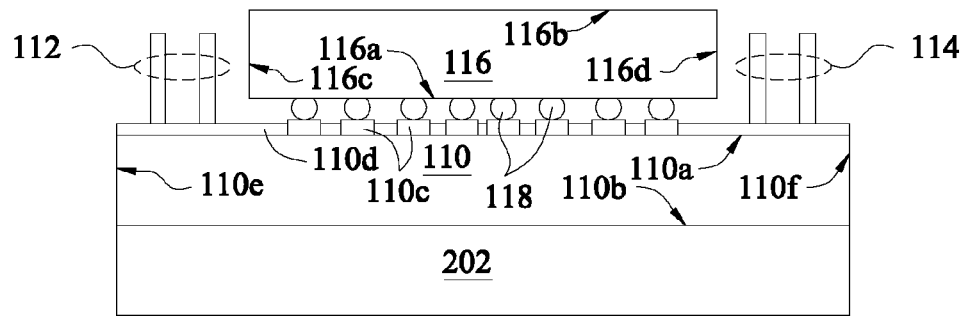

As shown in FIG. 2C, the second die 116 may be disposed over the first surface 110a of the first die 110, between the first via structure 112 and the second via structure 114. The second die 116 may be bonded to the first die 110 using a flip-chip mounting and bonding process in some embodiments. For example, the second die 116 may be manufactured in a separate process then inverted and coupled to the first die 110. The second plurality of connectors 118 may be formed on either the first surface 110a of the first die 110 or the first surface 116a of the second die 116 prior to mounting the second die 116 on the first die 110. A reflow process and/or a thermal compression process may be performed on the second plurality of connectors 118 to form the electrical connections between the first die 110 and the second die 116.

Figure 2D:
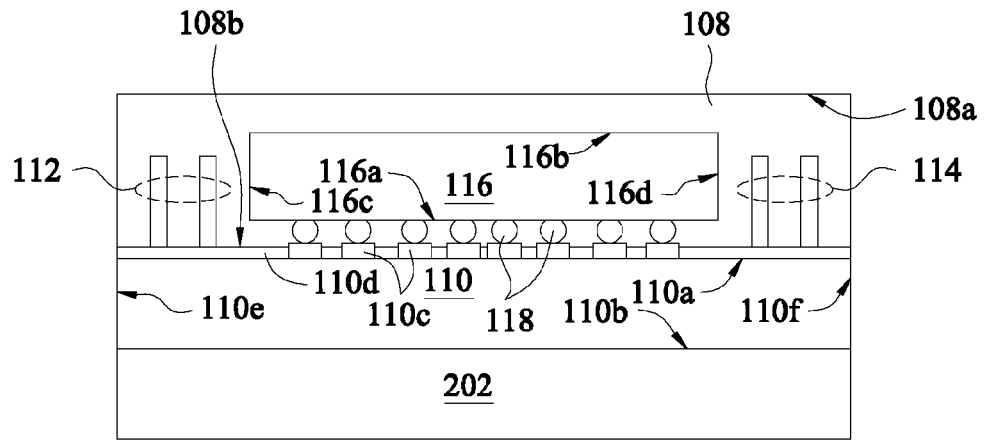

FIG. 2D shows the forming of the molding compound 108 over the first die 110 according to an embodiment. The molding compound 108 is additionally formed around and over the second die 116, the first via structure 112, and the second via structure 114. In the embodiment shown in FIG. 2D, the molding compound 108 has a lateral extent that is substantially equal to a lateral extent of the first die 110. In some embodiments, the molding compound 108 is shaped or molded using for example, a mold (not shown) which may have a border or other feature for retaining molding compound 108 when applied. Such a mold may be used to pressure mold the molding compound 108 over the first die 110 and around and over the second die 116 and the first and second via structures 112 and 114 to force the molding compound 108 into openings and recesses, eliminating air pockets or the like in the molding compound 108.

Figure 2E:
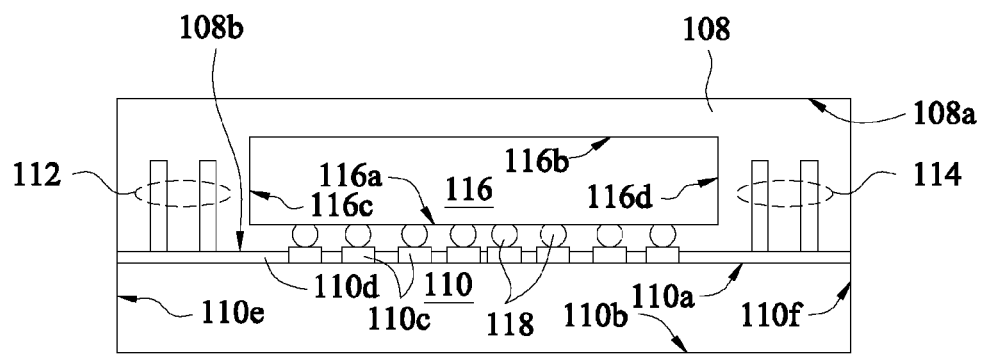

As shown in FIG. 2E, the first die 110 may be debonded from the first carrier 202. For example, a thermal debonding process or a laser debonding process may be utilized, depending upon the precise adhesive or DAF chosen to attach the first die 110 to the first carrier 202, although other suitable debonding processes may be used to separate the first die 110 from the first carrier 202. Furthermore, in the step shown in FIG. 2E, the first die 110 is also thinned by subjecting the second surface 110b of the first die 110 to grinding, CMP, etching or another process.

Figure 2F:
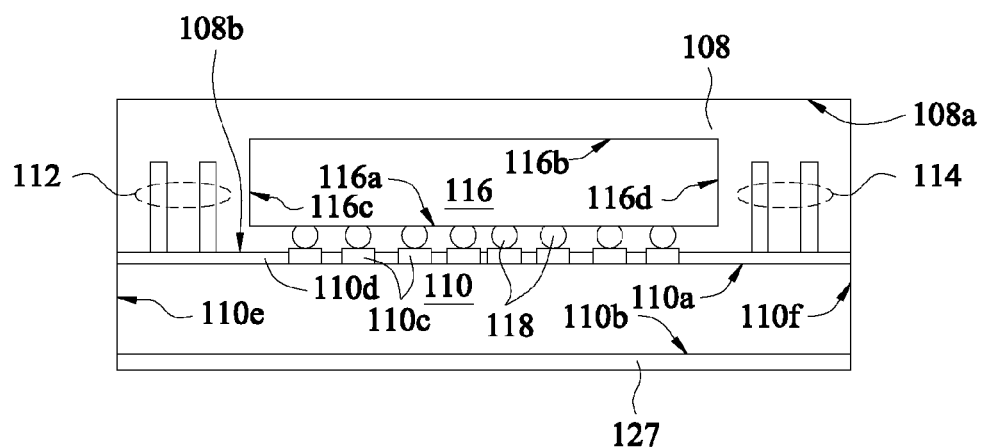

The steps shown in FIG. 2A to FIG. 2E may be wafer-level processes that may be performed on a plurality of first dies 110 arranged laterally adjacent to each other on a wafer. In such an embodiment, FIG. 2F shows that the wafer having the plurality of first dies 110 may be laminated at the second surface 110b of the first die 110 (e.g. by the adhesive layer 127). The wafer may subsequently be singulated to separate the plurality of first dies 110 from each other. The result is a single first die 110 having the second die 116 and the first and second via structures 112 and 114 encapsulated in the molding compound 108 and disposed thereon.

Figure 2G:
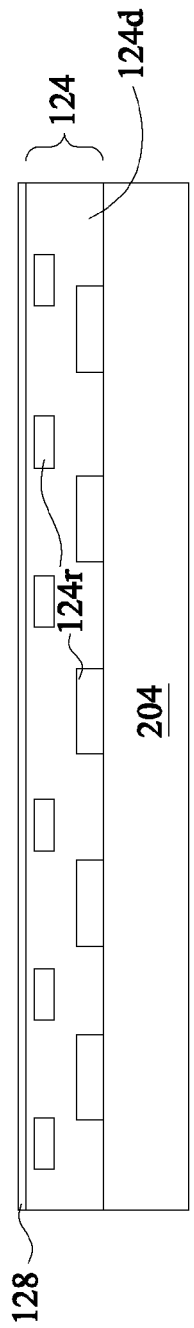

As shown in FIG. 2G, the second substrate 124 may be provided. The second substrate 124 may have the third RDL 128 formed thereon. Methods of forming an RDL on a surface of a substrate are known in the art and are not described here for the sake of brevity. The second substrate 124 may be bonded to a second carrier 204, which may provide temporary mechanical and structural support to the second substrate 124 during subsequent processing steps. In this manner, damage to the second substrate 124 is reduced or prevented. The second carrier 204 may include similar materials as the first carrier 202. In an embodiment, an adhesive may be used to attach the second substrate 124 to the second carrier 204. The adhesive may be any suitable adhesive, such as an ultraviolet (UV) glue, which loses its adhesive property when exposed to UV lights and/or a thermal release glue, which may lose its adhesive property when heated beyond a certain temperature. In another embodiment, a die attachment film (DAF) may be used to attach the second substrate 124 to the second carrier 204.

Figure 2H:
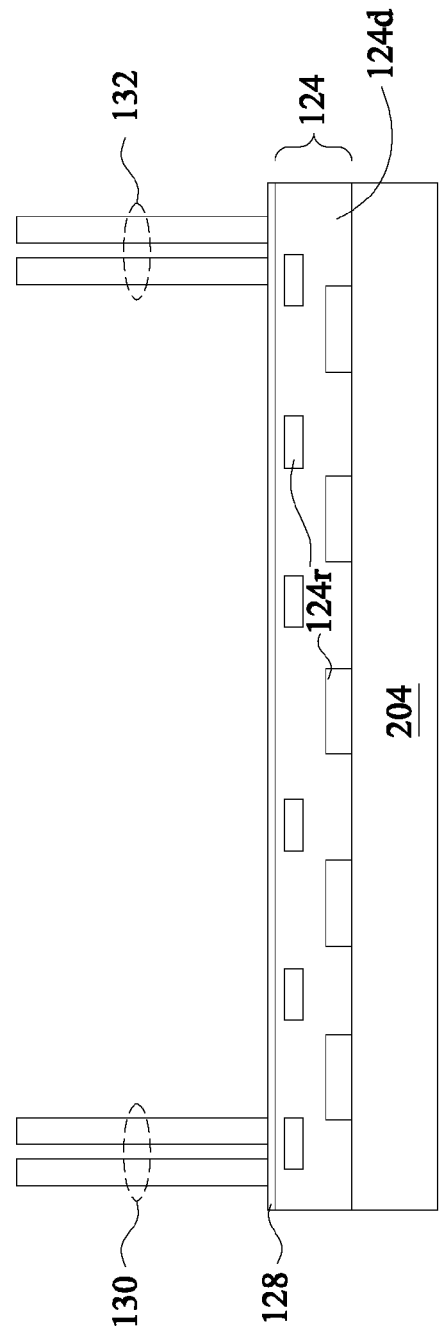

As shown in FIG. 2H, the third via structure 130 and the fourth via structure 132 are formed at the surface of the second substrate 124 facing away from the second carrier 204. The third via structure 130 and the fourth via structure 132 may be formed by any suitable techniques such as electroplating. Other processes of formation such as sputtering, evaporation, PECVD and/or the like may alternatively be used depending upon the desired materials. The third via structure 130 and the fourth via structure 132 are formed such that a spacing S between them is large enough to accommodate or receive the arrangement shown in FIG. 2F where a single first die 110 having the second die 116 and the first and second via structures 112 and 114 encapsulated in the molding compound 108 and disposed thereon.

Figure 2I:
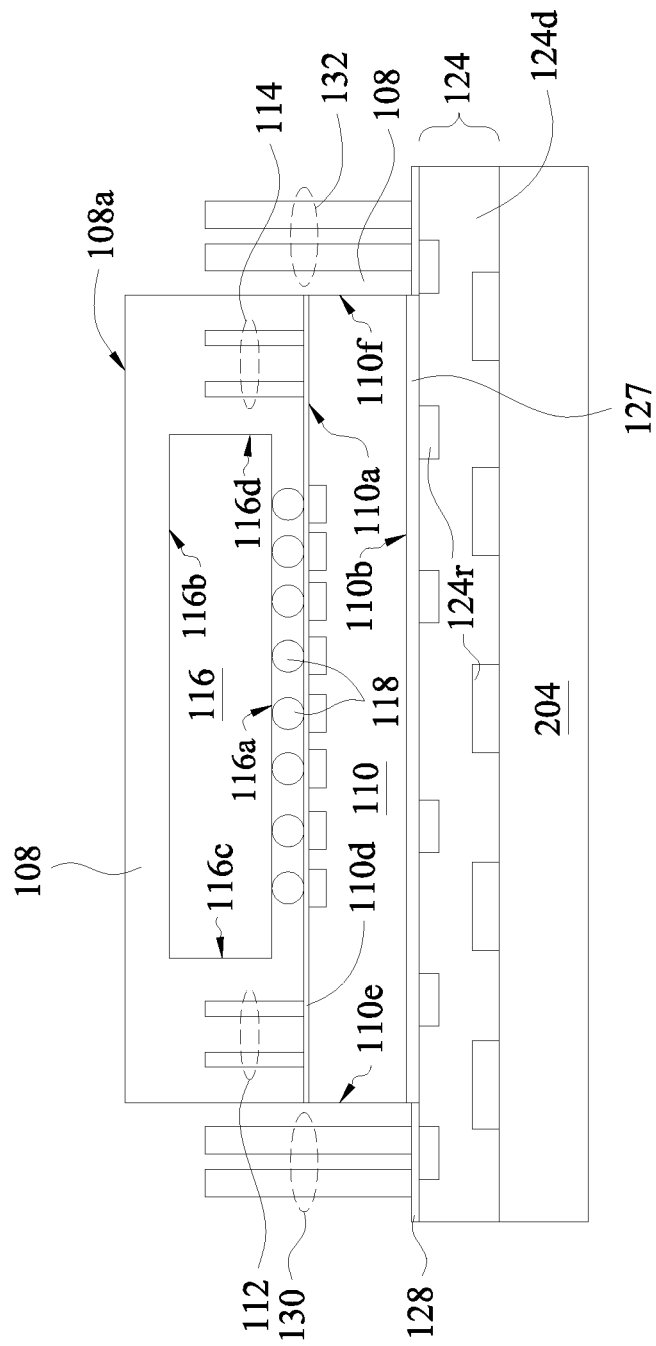

As shown in FIG. 2I, the first die 110 of FIG. 2F (having the second die 116 and the first and second via structures 112 and 114 encapsulated in the molding compound 108 and disposed thereon) is picked and placed on the surface of the second substrate 124 facing away from the second carrier 204. The first die 110 is also disposed between the third via structure 130 and the fourth via structure 132. The first die 110 is additionally spaced apart from the third via structure 130 and the fourth via structure 132, as shown in FIG. 2I. The first die 110 may be attached to the third RDL 128 by the adhesive layer 127, which may be attached to the second surface 110b of the first die 110 prior to placing the first die 110 on the surface of the second substrate 124 facing away from the second carrier 204.

Figure 2J:
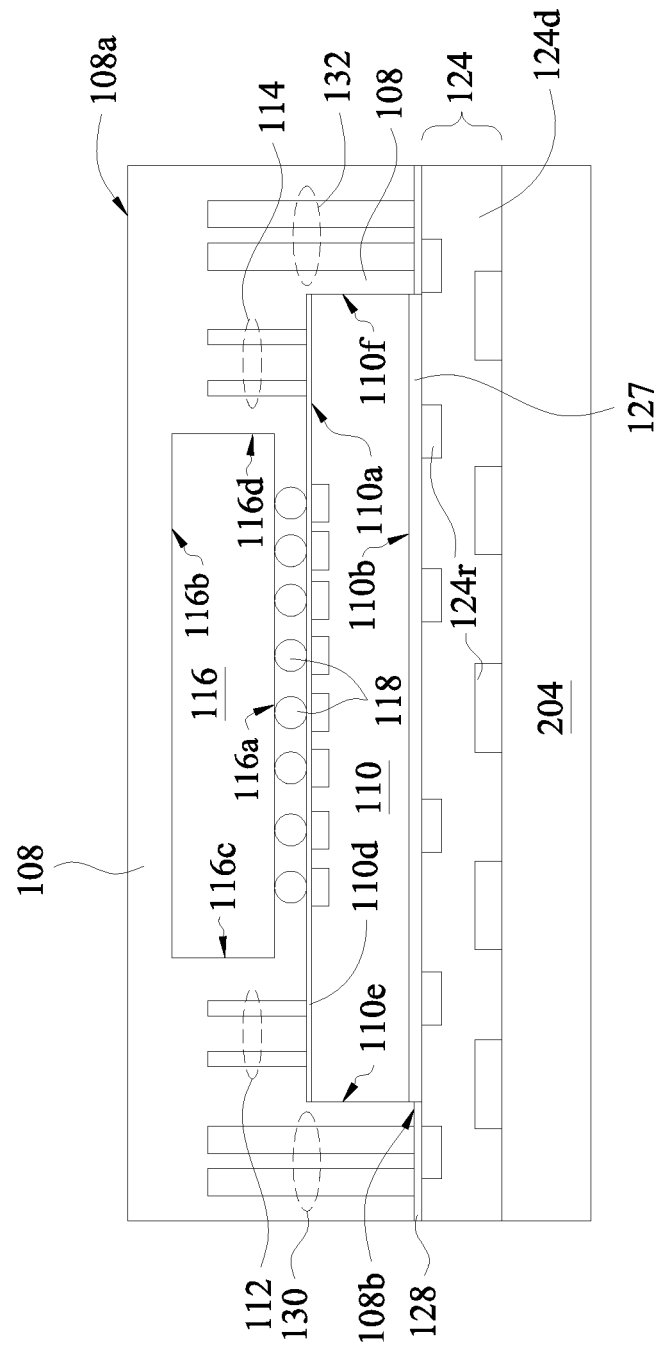

FIG. 2J shows the forming of the molding compound 108 over the second substrate 124 according to an embodiment. The molding compound 108 is additionally formed around the first die 110, the third via structure 130, and the second via structure 132. In the embodiment shown in FIG. 2J, the resultant molding compound 108 has a lateral extent that is substantially equal to a lateral extent of the second substrate 124. In some embodiments, the molding compound 108 is shaped or molded using for example, a mold (not shown) which may have a border or other feature for retaining molding compound 108 when applied. Such a mold may be used to pressure mold the molding compound 108 over the second substrate 124 and around the first die 110, the third via structure 130, and the fourth via structure 132 to force the molding compound 108 into openings and recesses, eliminating air pockets or the like in the molding compound 108.

Figure 2K:
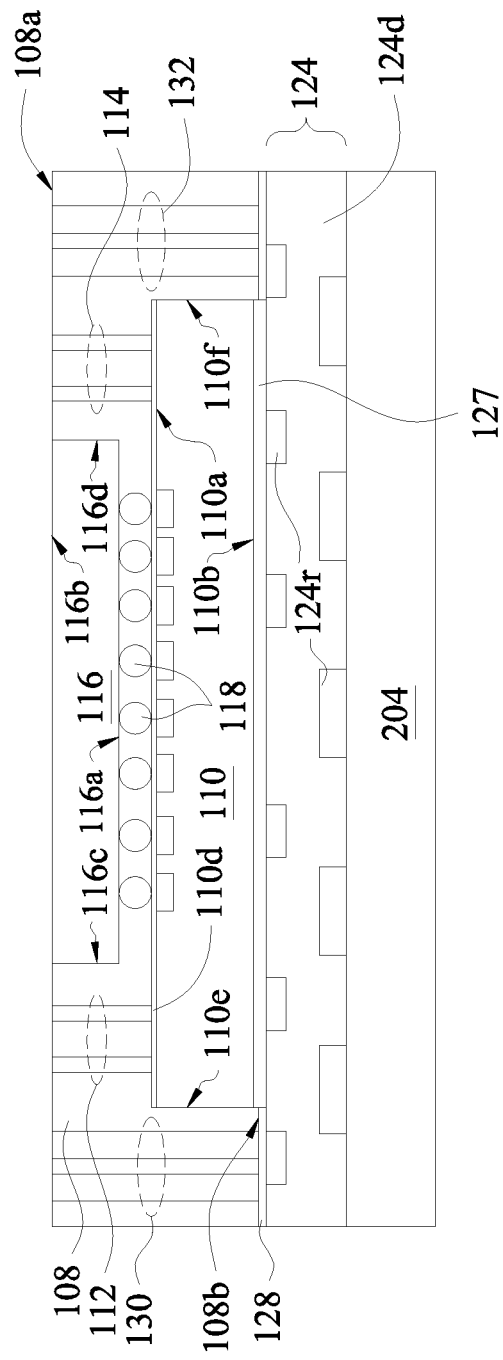

As shown in FIG. 2K, a thinning process may be performed on the second surface 116b of the second die 116 to expose the first via structure 112, the second via structure 114, the third via structure 130, and the fourth via structure 132. The thinning process may be performed using an etching process and/or a planarization process, such as a mechanical grinding process or a chemical mechanical polishing (CMP) process. In some embodiments, as in the example of FIG. 2K, the second die may be also be thinned.

Figure 2L:
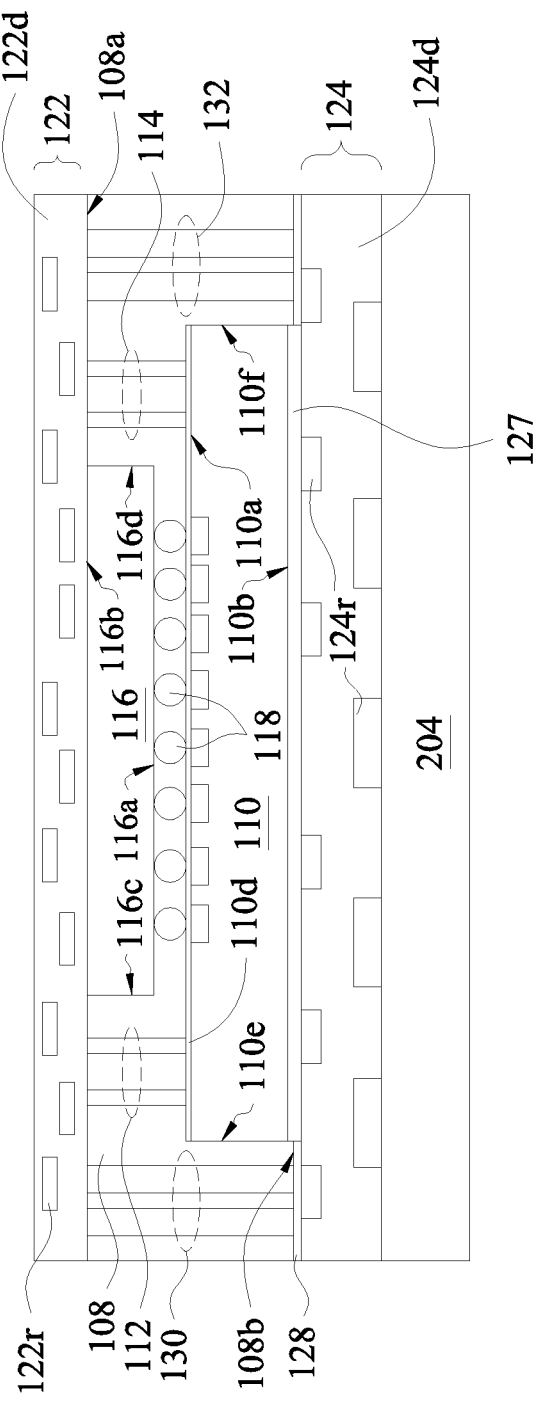
Figure 2M:
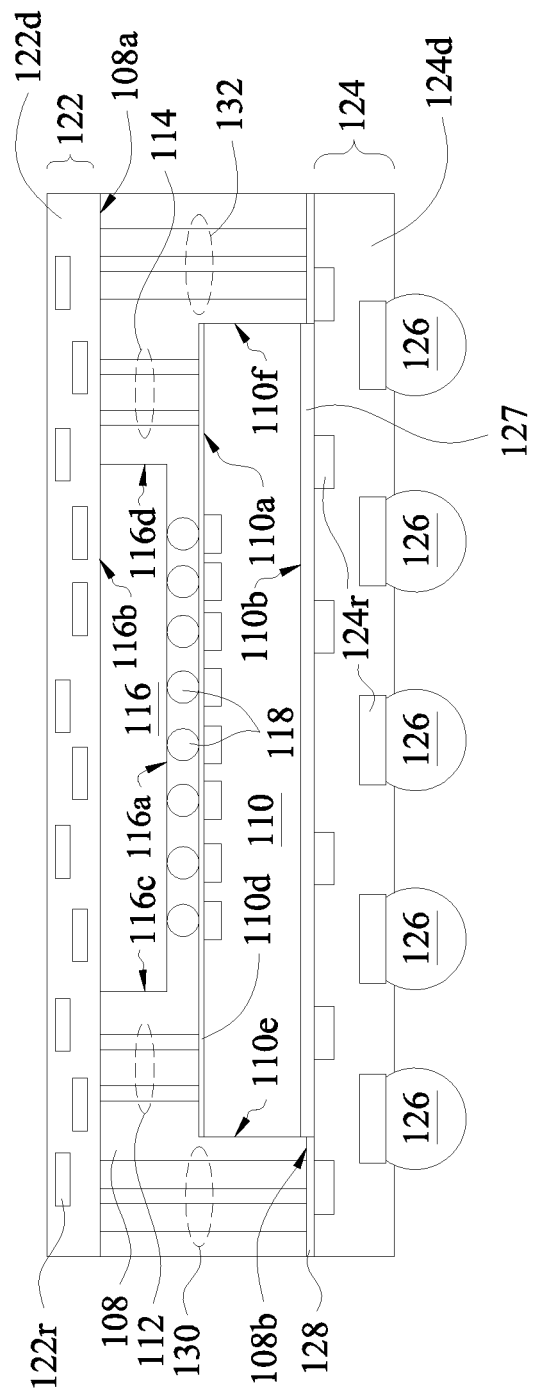

As shown in FIG. 2L, the first substrate 122 having the second RDL 120 formed on a surface thereof may be placed over the second surface 116b of the second die 116. As shown in FIG. 2M, the second substrate 124 may be debonded from the second carrier 204. For example, a thermal debonding process or a laser debonding process may be utilized, depending upon the precise adhesive or DAF chosen to attach the second substrate 124 to the second carrier 204, although other suitable debonding processes may be used to separate the second substrate 124 from the second carrier 204. Furthermore, some of the conductive structures 124r of the second substrate 124 may be exposed (e.g. by a laser opening process and/or etching process), and the third plurality of connectors 126 may be formed over the exposed conductive structures 124r (e.g. by a BGA mounting process). Consequently, the package 100 (e.g. as shown in FIG. 1A) is manufactured.

As described above in respect of the package 100 shown in FIG. 1B, the underfill layer 142 may be disposed in the space between the first surface 116a of the second die 116 and the first surface 110a of the first die 110, instead of the molding compound 108. In such an embodiment, the process flow shown in FIG. 2A to FIG. 2M may be modified to include the dispensing of an underfill material in the space between the first surface 116a of the second die 116 and the first surface 110a of the first die 110. For example, in the step illustrated in FIG. 2C, underfill material may be dispensed in this space after the second die 116 is flip chip bonded to the first die 110.

Figure 3:
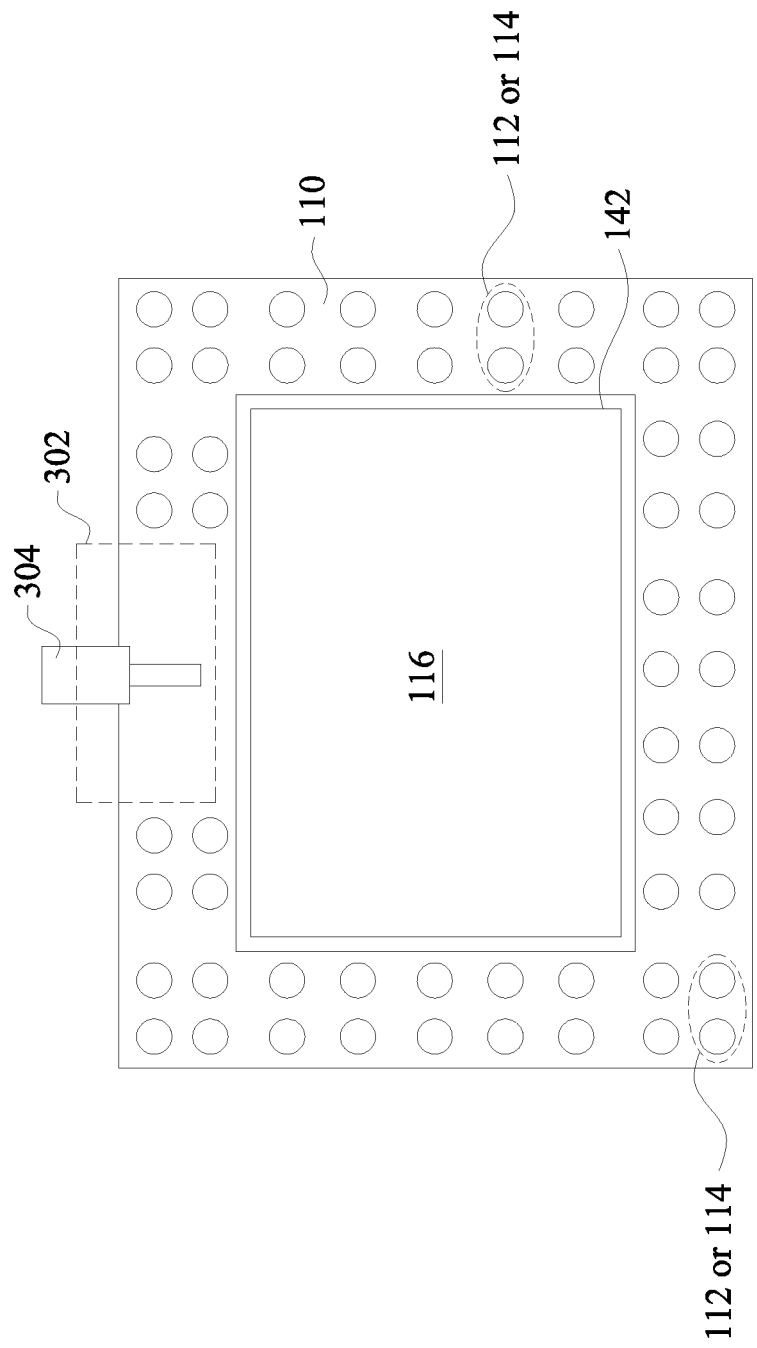
FIG. 3 shows a plan view illustrating the dispensing of an underfill material in a space between a first die and a second die, in accordance with some embodiments.

FIG. 3 shows a plan view illustrating the dispensing of the underfill material in the space between the first die 110 and the second die 116. As shown in FIG. 3, the first die 110 may include a region 302 on the first surface 110a of the first die 110 that is devoid of the first via structure 112 and the second via structure 114. Consequently, an underfill dispensing tool 304 may be positioned over this region 302 and the underfill material may be dispensed in the space between the first die 110 and the second die 116. Following this, the underfill material may be cured to form the underfill layer 142. In the embodiment shown in FIG. 3, only one region 302 that is devoid of the first via structure 112 and the second via structure 114 is shown. However, in another embodiment, there may be more than one such region 302, depending on design considerations. Subsequently, the process steps illustrated in FIG. 2D to FIG. 2M would include the underfill layer 142 disposed in the space between the first die 110 and the second die 116.

FIGS. 4A to 4L show a process flow illustrating a method of manufacturing the package 100, in accordance with one or more embodiments. The process flow shown in FIG. 4A to FIG. 4L may, for example, be used to manufacture the package 100 shown in FIG. 1E.

Figure 4A:
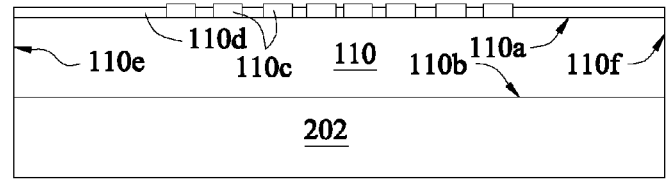
FIGS. 4A to 4L show a process flow illustrating a method of manufacturing a package, in accordance with some embodiments.
Figure 4B:
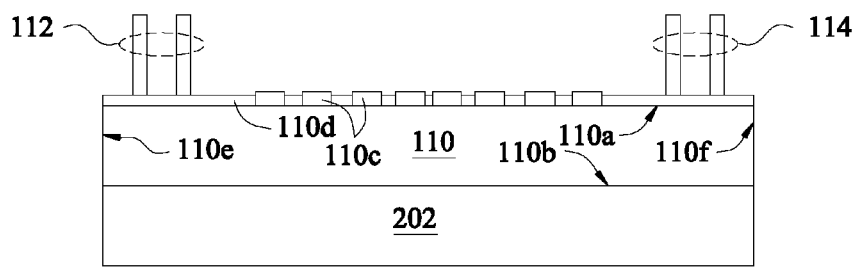
Figure 4C:
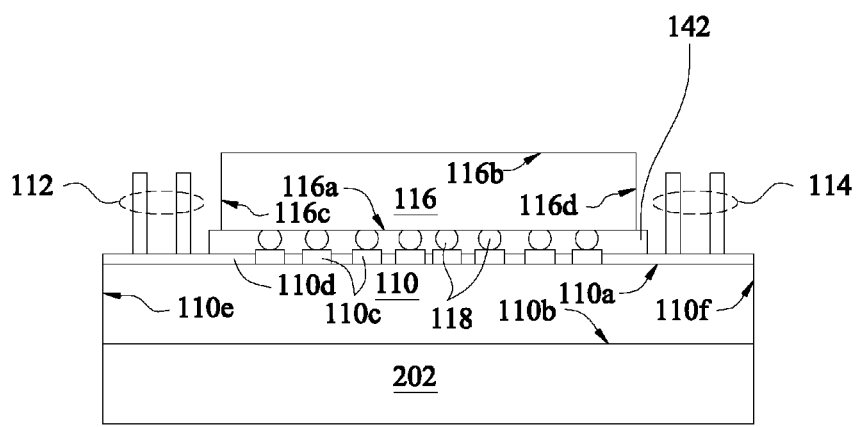

FIG. 4A to FIG. 4C are similar to FIG. 2A to FIG. 2C. Furthermore, as shown in FIG. 4C, the underfill layer 142 may be formed (e.g. using the process described above in respect of FIG. 3).

Figure 4D:
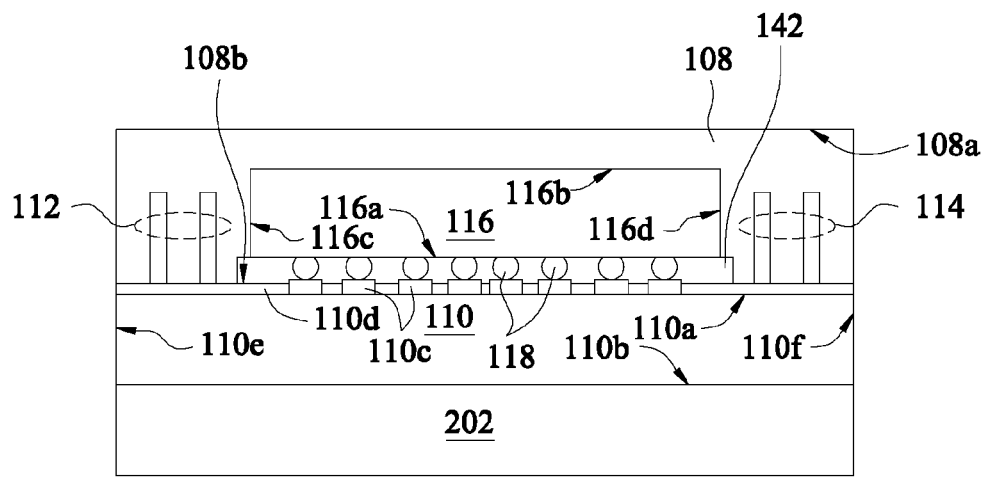

FIG. 4D shows the forming of the molding compound 108 over the first die 110 according to an embodiment. The molding compound 108 is additionally formed around and over the second die 116, the first via structure 112, and the second via structure 114. In the embodiment shown in FIG. 4D, the molding compound 108 has a lateral extent that is substantially equal to a lateral extent of the first die 110. In some embodiments, the molding compound 108 is shaped or molded using for example, a mold (not shown) which may have a border or other feature for retaining molding compound 108 when applied. Such a mold may be used to pressure mold the molding compound 108 over the first die 110 and around and over the second die 116 and the first and second via structures 112 and 114 to force the molding compound 108 into openings and recesses, eliminating air pockets or the like in the molding compound 108.

Figure 4E:
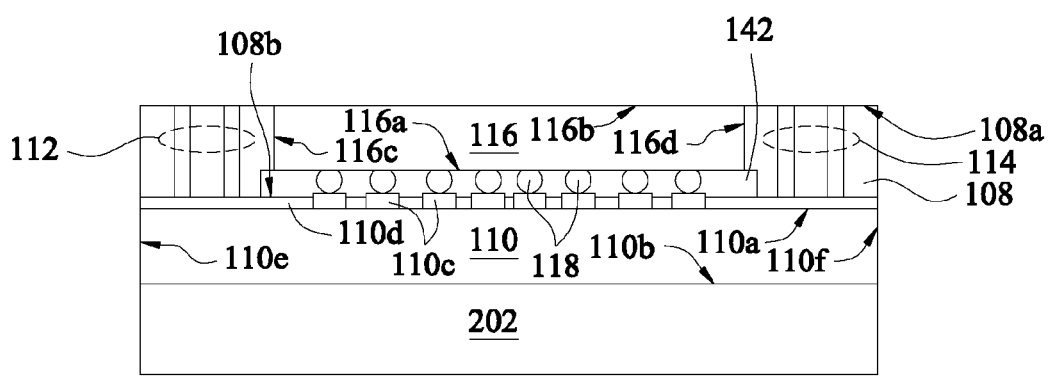

As shown in FIG. 4E, a thinning process may be performed on the second surface 116b of the second die 116 to expose the first via structure 112 and the second via structure 114. The thinning process may be performed using an etching process and/or a planarization process, such as a mechanical grinding process or a chemical mechanical polishing (CMP) process. In some embodiments, as in the example of FIG. 4E, the second die 116 may be also be thinned.

Figure 4F:
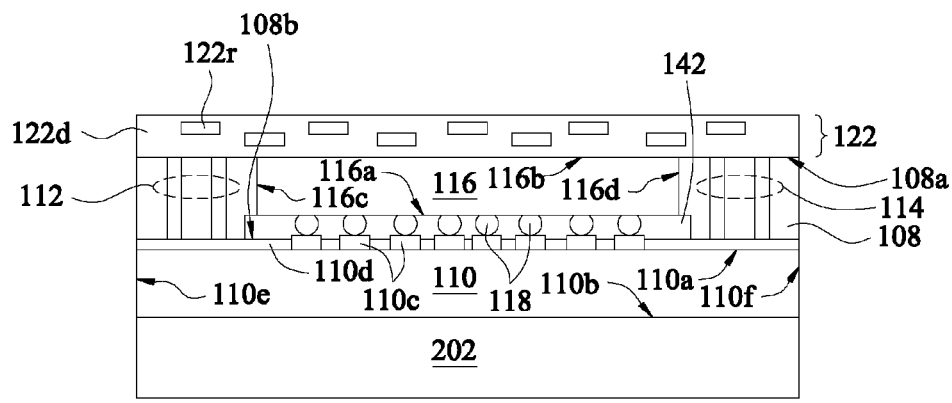

As shown in FIG. 4F, the first substrate 122 having the second RDL 120 formed on a surface thereof may be placed over the second surface 116b of the second die 116. In the embodiment shown in FIG. 4F, a lateral extent of the first substrate 122 may be substantially equal to a lateral extent of the first die 110.

Figure 4G:
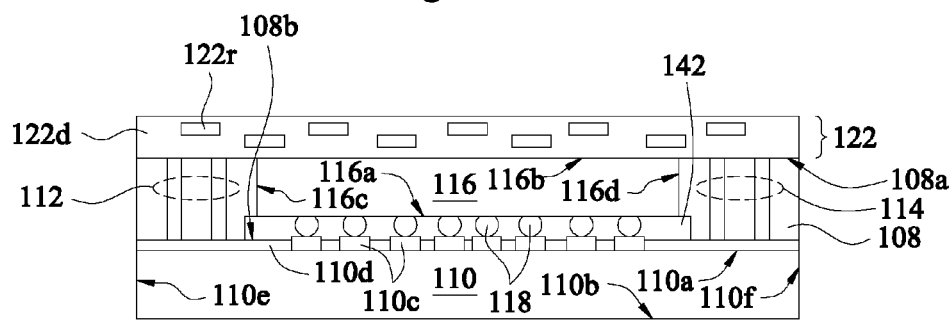

As shown in FIG. 4G, the first die 110 may be debonded from the first carrier 202. For example, a thermal debonding process or a laser debonding process may be utilized, depending upon the precise adhesive or DAF chosen to attach the first die 110 to the first carrier 202, although other suitable debonding processes may be used to separate the first die 110 from the first carrier 202. Furthermore, in the step shown in FIG. 4G, the first die 110 is also thinned by subjecting the second surface 110b of the first die 110 to grinding, CMP, etching or another process.

Figure 4H:
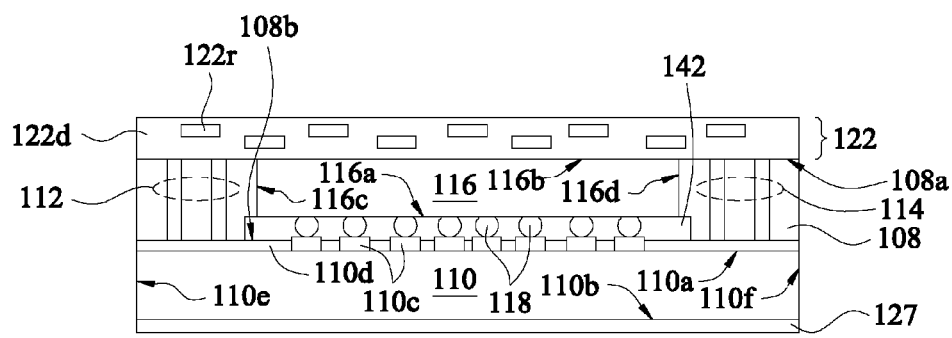

The steps shown in FIG. 4A to FIG. 4G may be wafer-level processes that may be performed on a plurality of first dies 110 arranged laterally adjacent to each other on a wafer. In such an embodiment, FIG. 4H shows that the wafer having the plurality of first dies 110 may be laminated at the second surface 110b of the first die 110 (e.g. by the adhesive layer 127). The wafer may subsequently be singulated to separate the plurality of first dies 110 from each other. The result is a single first die 110 having the second die 116 and the first and second via structures 112 and 114 encapsulated in the molding compound 108 and the first substrate 122 disposed thereon.

Figure 4I:
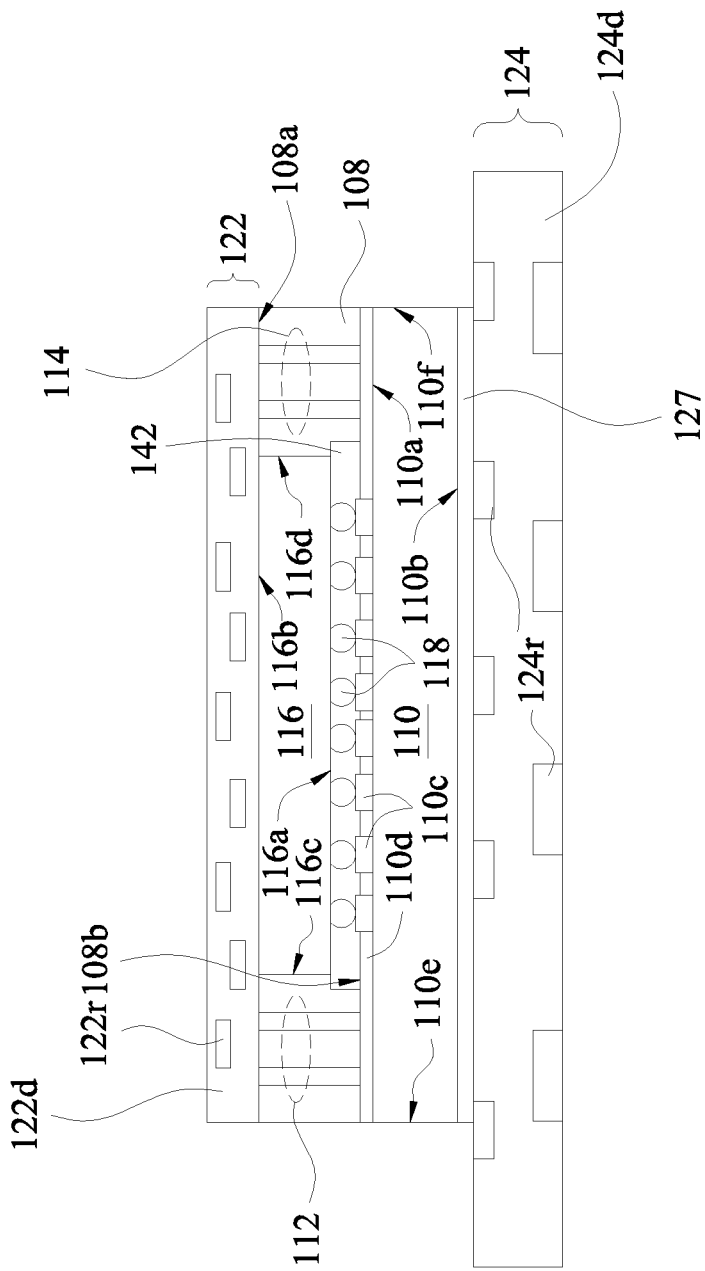
Figure 4J:
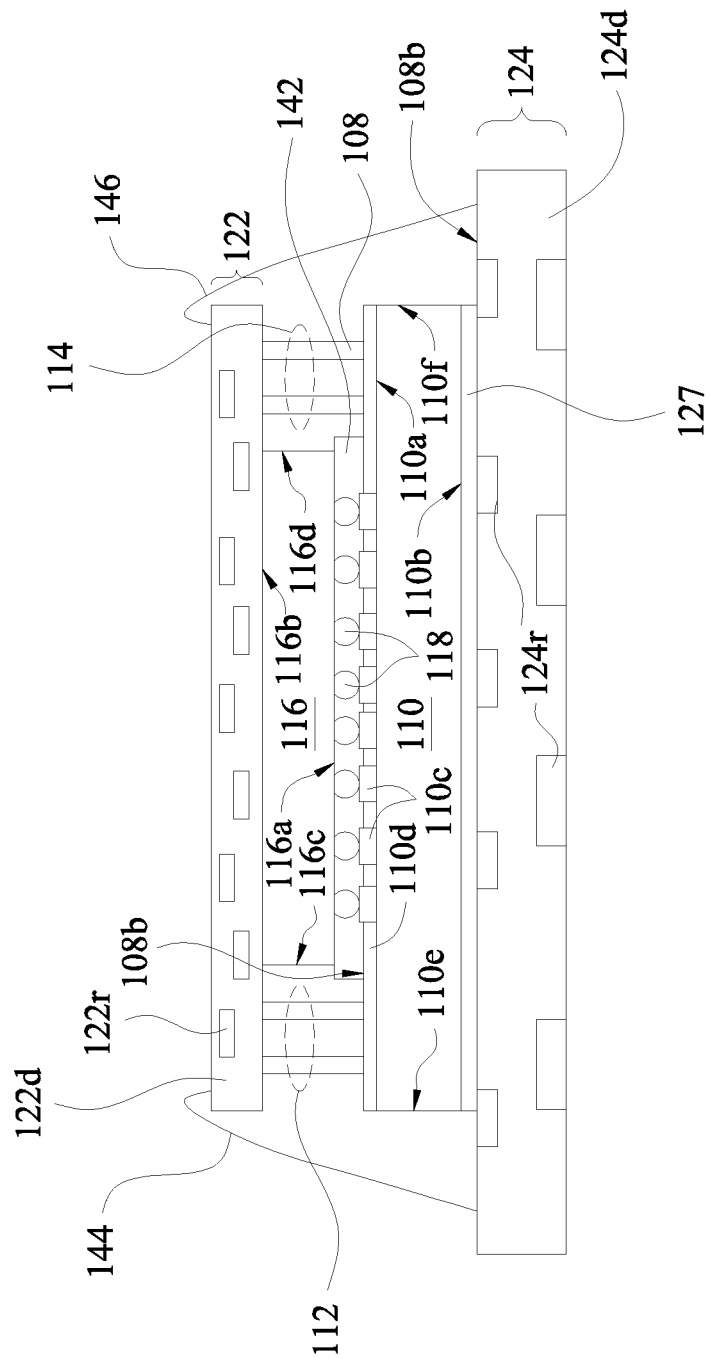

As shown in FIG. 4I, the first die 110 having the second die 116 and the first and second via structures 112 and 114 encapsulated in the molding compound 108 and the first substrate 122 disposed thereon is attached to the second substrate 124 using the adhesive layer 127. Subsequently, as shown in FIG. 4J, the first wirebond structure 144 and the second wirebond structure 146 are formed using a wirebond process. As shown in FIG. 4J, the first wirebond structure 144 and the second wirebond structure 146 may extend from a surface of the first substrate 122 facing the second chip package 104 to a surface of the second substrate 124 facing the second chip package 104. Additionally, the first wirebond structure 144 and the second wirebond structure 146 may be electrically connected or electrically coupled to the conductive structures 122r of the first substrate 122 and to the conductive structures 124r of the second substrate 124, e.g. by means of contact pads (not shown in FIG. 4J) disposed on the surfaces of the first substrate 122 and the second substrate 124.

Figure 4K:
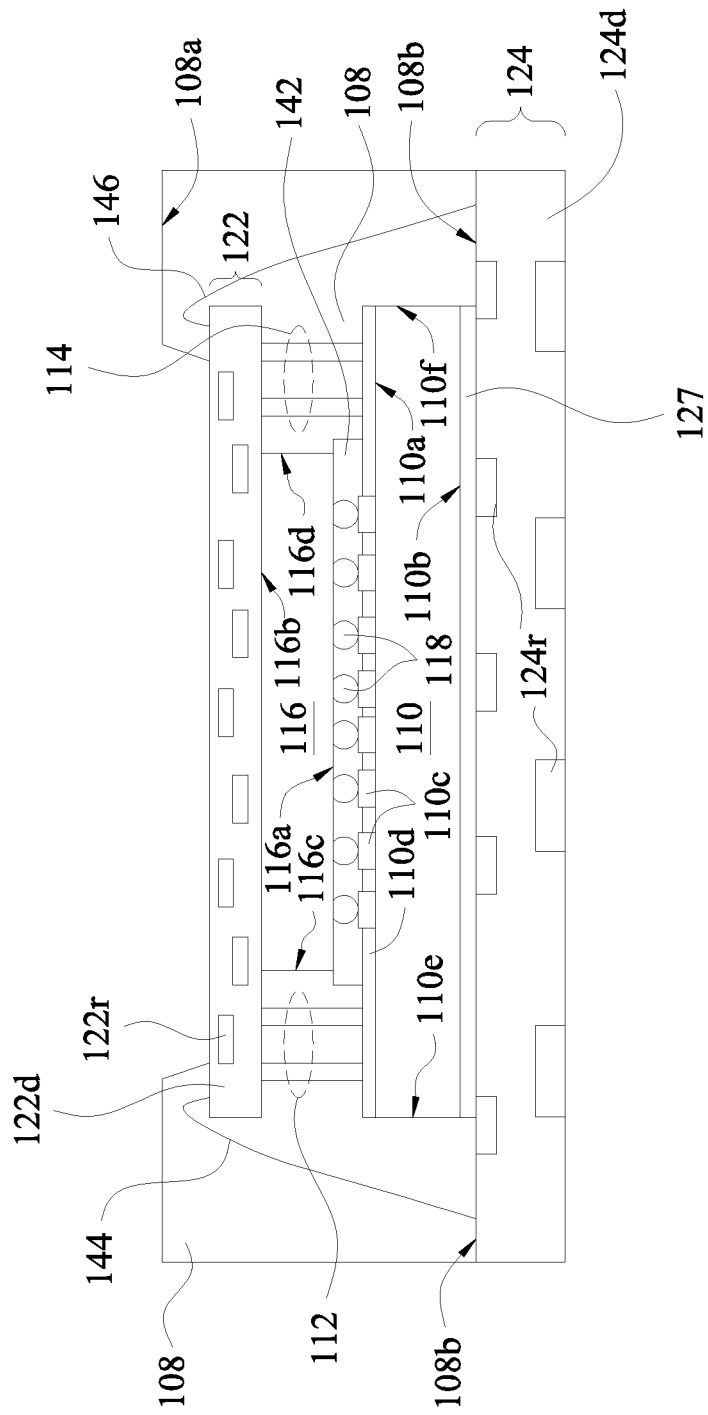

FIG. 4K shows the forming of the molding compound 108 over the second substrate 124 according to an embodiment. The molding compound 108 is additionally formed around and over the first wirebond structure 144 and the second wirebond structure 146. In the embodiment shown in FIG. 4K, the molding compound 108 has a lateral extent that is substantially equal to a lateral extent of the second substrate 124 and additionally encapsulates lateral regions of the first substrate 122 that have the first wirebond structure 144 and the second wirebond structure 146 bonded thereto. In some embodiments, the molding compound 108 is shaped or molded using for example, a mold (not shown) which may have a border or other feature for retaining molding compound 108 when applied. Such a mold may be used to pressure mold the molding compound 108 over the second substrate and around and over the first wirebond structure 144 and the second wirebond structure 146 to force the molding compound 108 into openings and recesses, eliminating air pockets or the like in the molding compound 108.

Figure 4L:
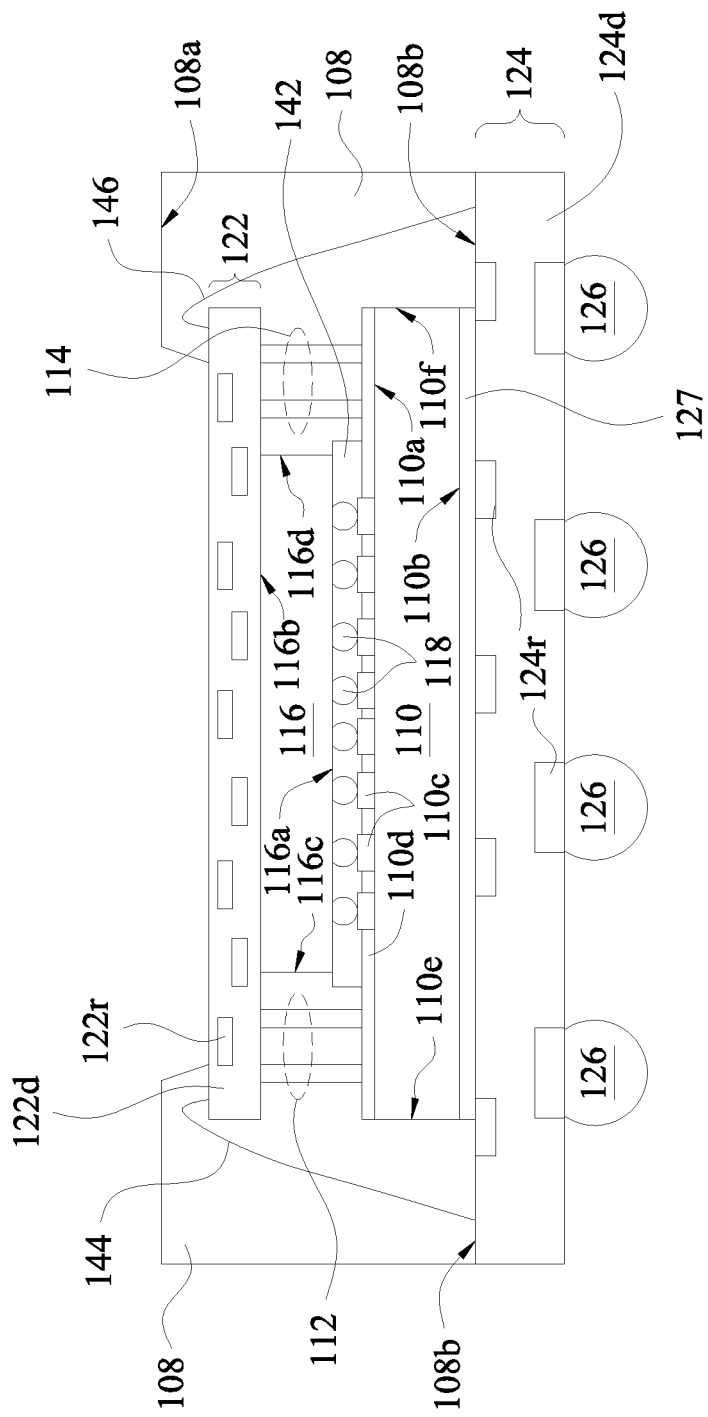

As shown in FIG. 4L, some of the conductive structures 124r of the second substrate 124 may be exposed (e.g. by a laser opening process and/or etching process), and the third plurality of connectors 126 may be formed over the exposed conductive structures 124r (e.g. by a BGA mounting process). Alternatively the second substrate 124 may be an organic substrate with finished contact pads such that BGA connectors can be directly mounted on to it. Consequently, the package 100 (e.g. as shown in FIG. 1E) is manufactured.

Figure 5:
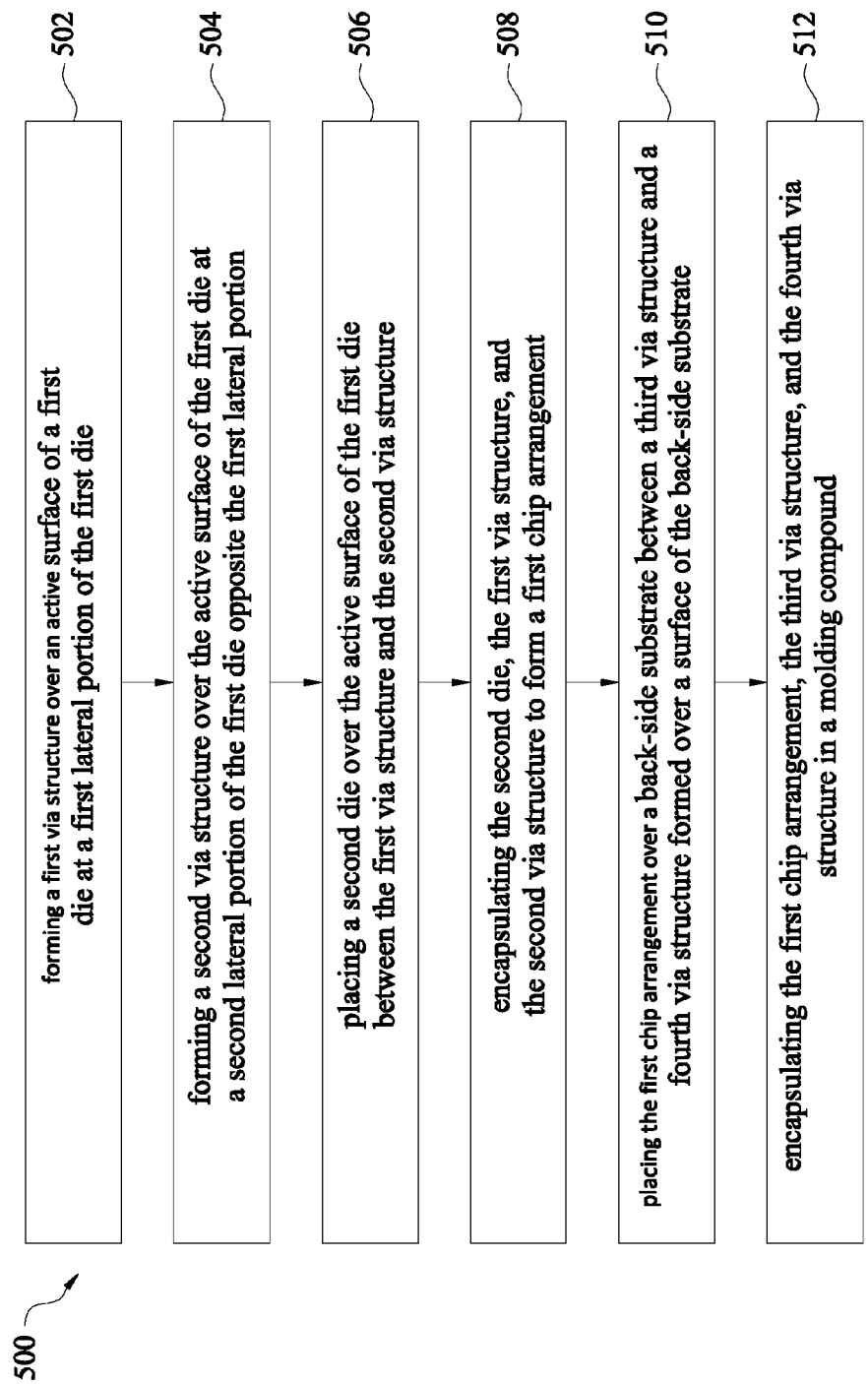
FIGS. 5 and 6 show methods of manufacturing packages, in accordance with some embodiments.

From the process flow described above in respect of FIG. 2A to FIG. 2M, a method 500 (shown in FIG. 5) for manufacturing a package may be provided. The method 500 may include: forming a first via structure over an active surface of a first die at a first lateral portion of the first die (in 502); forming a second via structure over the active surface of the first die at a second lateral portion of the first die opposite the first lateral portion (in 504); placing a second die over the active surface of the first die between the first via structure and the second via structure (in 506); encapsulating the second die, the first via structure, and the second via structure to form a first chip arrangement (in 508); placing the first chip arrangement over a back-side substrate between a third via structure and a fourth via structure formed over a surface of the back-side substrate (in 510); and encapsulating the first chip arrangement, the third via structure, and the fourth via structure in a molding compound (in 512). The method 500 may additionally include: placing a front-side substrate over the molding compound and over a surface of the second die facing away from the first die (in 514); and opening contact pads of the back-side substrate and mounting BGA balls over at least one of the back-side substrate and the front-side substrate (in 516). When mounting BGA balls on the front-side substrate, the method 500 can be extended to represent the process flow of manufacturing FIG. 1D.

Figure 6:
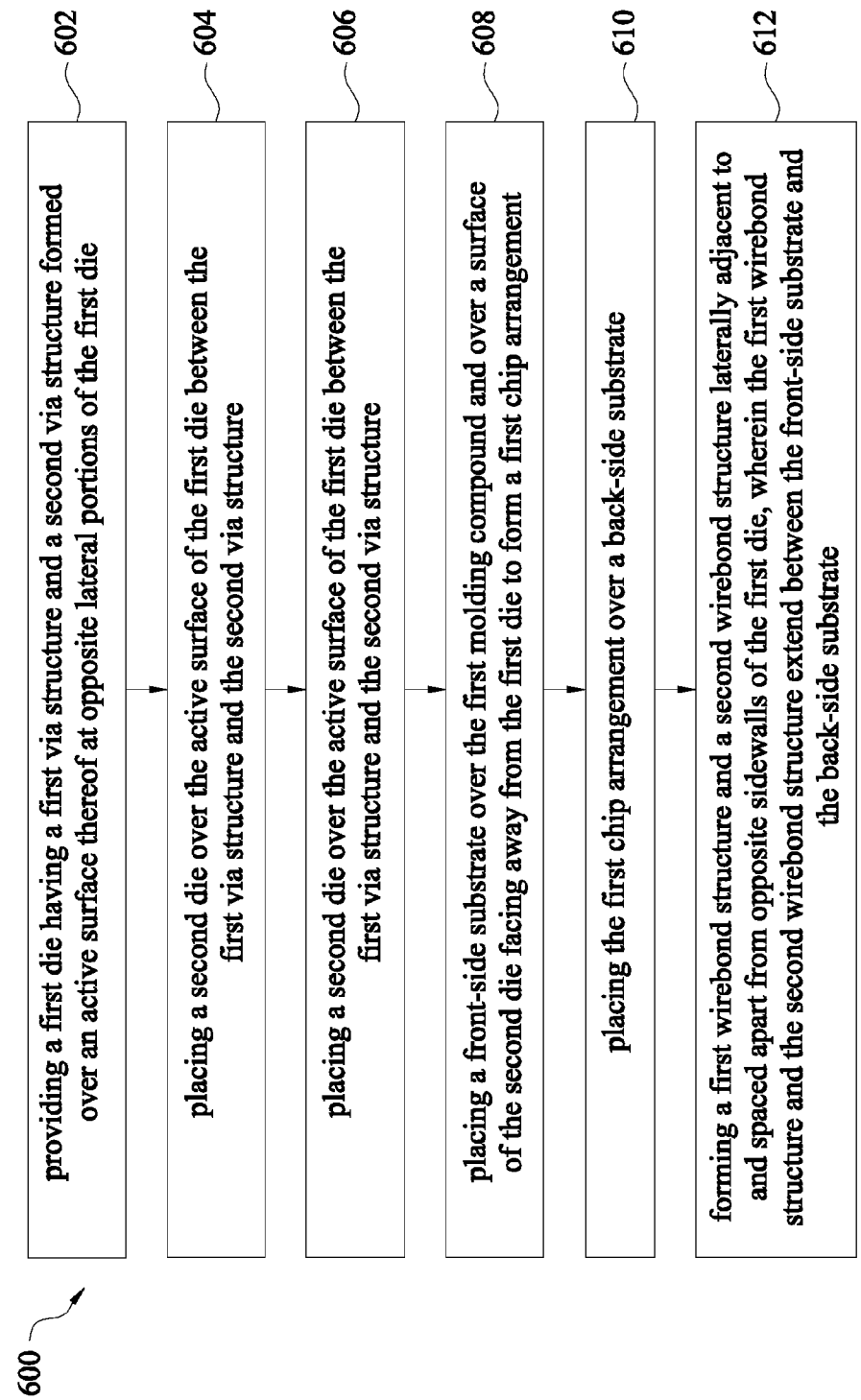

From the process flow described above in respect of FIG. 4A to FIG. 4L, a method 600 (shown in FIG. 6) for manufacturing a package may be provided. The method 600 may include: providing a first die having a first via structure and a second via structure formed over an active surface thereof at opposite lateral portions of the first die (in 602); placing a second die over the active surface of the first die between the first via structure and the second via structure (in 604); encapsulating the second die, the first via structure, and the second via structure in a first molding compound (in 606); placing a front-side substrate over the first molding compound and over a surface of the second die facing away from the first die to form a first chip arrangement (in 608); placing the first chip arrangement over a back-side substrate (in 610); and forming a first wirebond structure and a second wirebond structure laterally adjacent to and spaced apart from opposite sidewalls of the first die, wherein the first wirebond structure and the second wirebond structure extend between the front-side substrate and the back-side substrate (in 612). The method 600 may additionally include: opening contact pads of the back-side substrate and mounting BGA balls over at least one of the back-side substrate and the front-side substrate (in 614).

According to various embodiments presented herein, a package may be provided. In an embodiment, the package may include: a first chip package and a die structure disposed over the first chip package. The first chip package may include: a molding compound; a first die within the molding compound; a first via structure within the molding compound at a first lateral portion of the first die, the first via structure extending between an active surface of the first die and a first surface of the molding compound; a second via structure within the molding compound at a second lateral portion of the first die opposite the first lateral portion, the second via structure extending between the active surface of the first die and the first surface of the molding compound; and a second die within the molding compound, the second die disposed at the active surface of the first die and between the first via structure and the second via structure. The die structure may include at least one of an overlying chip or a second chip package.

In another embodiment, the package may include: a die structure disposed over a first chip package. The first chip package may include: a molding compound; at least one first via and at least one second via extending between a first surface of the molding compound and a second surface of the molding compound opposite the first surface; a first die within the molding compound and proximate the first surface of the molding compound, the first die disposed between the at least one first via and the at least one second via; and a second die within the molding compound, the second die disposed at a first surface of the first die.

In yet another embodiment, the package may include: a die structure disposed over a first chip package. The first chip package may include: a molding compound; a first die within the molding compound; and a second die within the molding compound, the second die disposed at an active surface of the first die.

According to various embodiments presented herein, a method of manufacturing package may be provided. In an embodiment, the method may include: forming a first via structure over an active surface of a first die at a first lateral portion of the first die; forming a second via structure over the active surface of the first die at a second lateral portion of the first die opposite the first lateral portion; placing a second die over the active surface of the first die between the first via structure and the second via structure; encapsulating the second die, the first via structure, and the second via structure to form a first chip arrangement; placing the first chip arrangement over a back-side substrate between a third via structure and a fourth via structure formed over a surface of the back-side substrate; and encapsulating the first chip arrangement, the third via structure, and the fourth via structure in a molding compound.

According to various embodiments presented herein, a method of manufacturing package may be provided. In an embodiment, the method may include: providing a first die having a first via structure and a second via structure formed over an active surface thereof at opposite lateral portions of the first die; placing a second die over the active surface of the first die between the first via structure and the second via structure; encapsulating the second die, the first via structure, and the second via structure in a first molding compound; placing a front-side substrate over the first molding compound and over a surface of the second die facing away from the first die to form a first chip arrangement; placing the first chip arrangement over a back-side substrate; and forming a first wirebond structure and a second wirebond structure laterally adjacent to and spaced apart from opposite sidewalls of the first die, wherein the first wirebond structure and the second wirebond structure extend between the front-side substrate and the back-side substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first chip package comprising:
     a molding compound;
     a first die within the molding compound;
     a first via structure within the molding compound at a first lateral portion of the first die, the first via structure extending between an active surface of the first die and a first surface of the molding compound;
     a second via structure within the molding compound at a second lateral portion of the first die opposite the first lateral portion, the second via structure extending between the active surface of the first die and the first surface of the molding compound;
     a third via structure within the molding compound laterally adjacent to and spaced apart from a first sidewall of the first die;
     a fourth via structure within the molding compound laterally adjacent to and spaced apart from a second sidewall of the first die opposite the first sidewall, wherein the third via structure and the fourth via structure extend between the first surface of the molding compound and a second surface of the molding compound opposite the first surface;
     a second die within the molding compound, the second die disposed at the active surface of the first die and between the first via structure and the second via structure;
     a redistribution layer (RDL) disposed over the first surface of the molding compound, wherein the RDL electrically connects the first via structure and the second via structure to the third via structure and the fourth via structure respectively; and
     the first die attached to a substrate with an adhesive layer; and
   a die structure disposed over the first chip package.

2. The package of claim 1, wherein the die structure comprises at least one of an overlying chip or a second chip package.

3. The package of claim 2, wherein the second chip package comprises at least one of a low power double data rate die, a wide input-output memory chip, or a flash memory chip.

4. The package of claim 1, wherein the first chip package further comprises:
   a plurality of first connectors disposed between the first chip package and the die structure, the plurality of first connectors electrically connecting the first chip package and the die structure to each other.

5. The package of claim 1, wherein the second die is closer to the die structure than the first die, and wherein the first surface of the molding compound faces the die structure.

6. The package of claim 1, wherein an active surface of the second die faces the active surface of the first die.

7. A package comprising:
   a die structure disposed over a first chip package, the first chip package comprising:
     a molding compound;
     at least one first via and at least one second via extending between a first surface of the molding compound and a second surface of the molding compound opposite the first surface;
     a first die within the molding compound and proximate the first surface of the molding compound, the first die disposed between the at least one first via and the at least one second via;
     a second die within the molding compound, the second die disposed at a first surface of the first die;
     at least one third via within the molding compound laterally adjacent to and spaced apart from a first sidewall of the second die;
     at least one fourth via within the molding compound laterally adjacent to and spaced apart from a second sidewall of the second die opposite the first sidewall, wherein the at least one third via and the at least one fourth via extend between the first surface of the first die and the second surface of the molding compound;
a redistribution layer (RDL) disposed over the second surface of the molding compound, wherein the RDL electrically connects the at least one first via and the at least one second via to the at least one third via and the at least one fourth via respectively; and
a substrate disposed over the redistribution layer, the substrate different than the redistribution layer, the redistribution layer interposed between and in physical contact with the substrate and the second die.

8. A package comprising:
a first chip package comprising:
a molding compound;
a first die within the molding compound;
a first via structure within the molding compound at a first lateral portion of the first die, the first via structure extending between an active surface of the first die and a first surface of the molding compound;
a second via structure within the molding compound at a second lateral portion of the first die opposite the first lateral portion, the second via structure extending between the active surface of the first die and the first surface of the molding compound;
a third via structure within the molding compound laterally adjacent to and spaced apart from a first sidewall of the first die;
a fourth via structure within the molding compound laterally adjacent to and spaced apart from a second sidewall of the first die opposite the first sidewall, wherein the third via structure and the fourth via structure extend between the first surface of the molding compound and a second surface of the molding compound opposite the first surface;
a second die within the molding compound, the second die disposed at the active surface of the first die;
a redistribution layer (RDL) disposed over the first surface of the molding compound, wherein the RDL electrically connects the first via structure and the second via structure to the third via structure and the fourth via structure respectively; and
a back-side substrate disposed under the second surface of the molding compound, a first side of the back-side substrate proximate the second surface of the molding compound, the back-side substrate comprising a plurality of connectors disposed on a second side of the back-side substrate opposite the first side, at least a portion of the back-side substrate attached to the first die with an adhesive layer; and
a die structure disposed over the first chip package.

9. The package of claim 1, wherein the RDL electrically connects the first via structure and the second via structure.

10. The package of claim 1, wherein the RDL electrically connects the first via structure and the third via structure.

11. The package of claim 7, wherein the die structure comprises at least one of an overlying chip or a second chip package.

12. The package of claim 11, wherein the second chip package comprises at least one of a low power double data rate die, a wide input-output memory chip, or a flash memory chip.

13. The package of claim 7, wherein the first chip package further comprises:
a plurality of first connectors disposed between the first chip package and the die structure, the plurality of first connectors electrically connecting the first chip package and the die structure to each other.

14. The package of claim 7, wherein the second die is closer to the die structure than the first die, and wherein the first surface of the molding compound is directed toward the die structure.

15. The package of claim 7, wherein an active surface of the second die is directed toward the active surface of the first die.

16. The package of claim 7, wherein the RDL electrically connects the at least one first via and the at least one second via.

17. The package of claim 7, wherein the RDL electrically connects the at least one first via and the at least one third via.

18. The package of claim 8, wherein the die structure comprises at least one of an overlying chip or a second chip package.

19. The package of claim 18, wherein the second chip package comprises at least one of a low power double data rate die, a wide input-output memory chip, or a flash memory chip.

20. The package of claim 8, wherein an active surface of the second die faces the active surface of the first die.

* * * * *